(12) United States Patent
Dhindsa

(10) Patent No.: US 12,142,469 B2
(45) Date of Patent: Nov. 12, 2024

(54) PLASMA PROCESSING CHAMBERS CONFIGURED FOR TUNABLE SUBSTRATE AND EDGE SHEATH CONTROL

(71) Applicant: Applied Materials, Inc., Santa Clara, CA (US)

(72) Inventor: Rajinder Dhindsa, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 113 days.

(21) Appl. No.: 17/970,454

(22) Filed: Oct. 20, 2022

(65) Prior Publication Data

US 2023/0130829 A1     Apr. 27, 2023

Related U.S. Application Data

(60) Provisional application No. 63/270,428, filed on Oct. 21, 2021.

(51) Int. Cl.
*H01J 37/32* (2006.01)
*H01L 21/683* (2006.01)

(52) U.S. Cl.
CPC .... *H01J 37/3299* (2013.01); *H01J 37/32128* (2013.01); *H01J 37/32146* (2013.01); *H01J 37/32568* (2013.01); *H01J 37/32642* (2013.01); *H01J 37/32715* (2013.01); *H01L 21/6831* (2013.01); *H01J 2237/2007* (2013.01); *H01J 2237/24578* (2013.01); *H01J 2237/3341* (2013.01)

(58) Field of Classification Search
CPC ............. H01J 37/3299; H01J 37/32128; H01J 37/32146; H01J 37/32568; H01J 37/32642; H01J 37/32715; H01J 2237/2007; H01J 2237/24578; H01J 2237/3341; H01J 37/32091; H01J 37/32532; H01J 37/32541; H01J 37/32577; H01J 37/32706; H01J 37/32935; H01L 21/6831; H01L 21/67109
See application file for complete search history.

(56) References Cited

U.S. PATENT DOCUMENTS

| 2022/0037121 | A1* | 2/2022 | Dorf | H01L 21/31116 |
| 2022/0189738 | A1* | 6/2022 | Evans | H01J 37/32183 |
| 2022/0367149 | A1* | 11/2022 | Funk | H01L 21/67069 |
| 2022/0406567 | A1* | 12/2022 | Yang | H01J 37/32128 |

\* cited by examiner

*Primary Examiner* — Minh D A
(74) *Attorney, Agent, or Firm* — Patterson + Sheridan, LLP

(57) ABSTRACT

Embodiments herein provide plasma processing chambers and methods configured for fine-tuning and control over a plasma sheath formed during the plasma-assisted processing of a semiconductor substrate. Embodiments include a sheath tuning scheme, including plasma processing chambers and methods, which can be used to tailor one or more characteristics of a plasma sheath formed between a bulk plasma and a substrate surface. Generally, the sheath tuning scheme provides differently configured pulsed voltage (PV) waveforms to a plurality of bias electrodes embedded beneath the surface of a substrate support in an arrangement where each of the electrodes can be used to differentially bias a surface region of a substrate positioned on the support. The sheath tuning scheme disclosed herein can thus be used to adjust and/or control the directionality, and energy and angular distributions of ions that bombard a substrate surface during a plasma-assisted etch process.

19 Claims, 15 Drawing Sheets

Section A-A

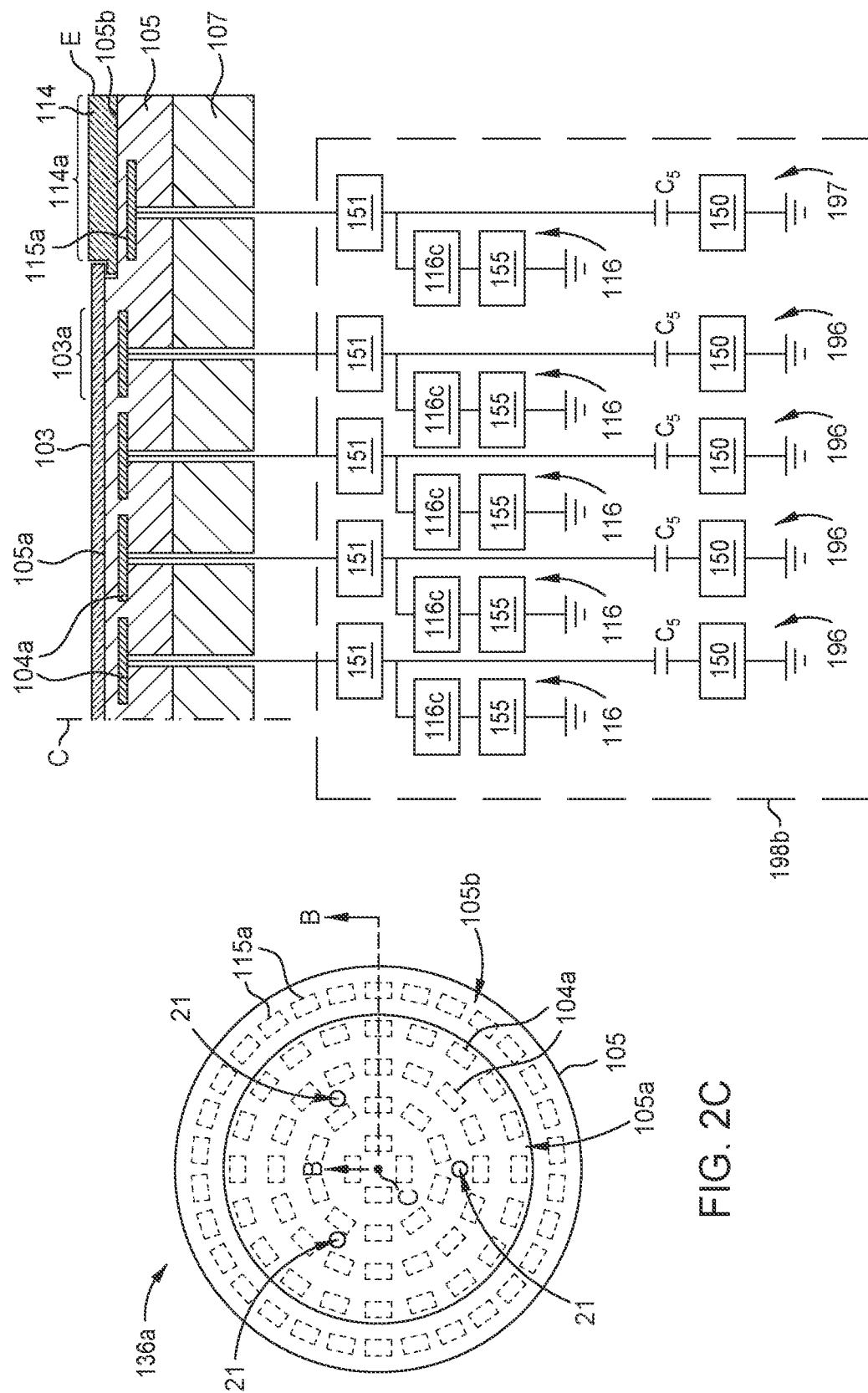

Section B-B

PLASMA PROCESSING CHAMBERS CONFIGURED FOR TUNABLE SUBSTRATE AND EDGE SHEATH CONTROL

CROSS-REFERENCE TO RELATED APPLICATIONS

This application claims the benefit of U.S. Provisional Application No. 63/270,428 filed on Oct. 21, 2021, which is herein incorporated by reference.

BACKGROUND

Field

Embodiments herein are directed to plasma-generating gas or vapor electric space discharge devices, particularly processing chambers configured to generate a capacitively coupled or inductively coupled plasma of gas or vapor material supplied to a chamber volume.

Description of the Related Art

Reliably forming high aspect ratio features is one of the key technology challenges for manufacturing the next generation of semiconductor devices. High aspect ratio openings used to form the features are typically formed using a plasma-assisted etch process, such as a reactive ion etch (RIE) process capable of directionally controlled (i.e., anisotropic) material removal to transfer a pattern from a mask layer to exposed portions of the substrate surface there beneath. As feature sizes continue to shrink and pattern density continues to increase, the degree of anisotropy and within-substrate processing uniformity of the RIE process are critical factors in forming closely spaced (fine pitched) high aspect ratio openings.

In an example reactive ion etch process, a substrate is positioned in a processing chamber, a plasma of one or more processing gases is generated in the processing chamber, e.g., by use of a radio frequency (RF) power, and a plasma sheath, i.e., a region depleted of electrons, is formed between the plasma and the substrate surface, e.g., by use of an applied RF bias power. Openings in the mask layer are transferred to the substrate surface through a synergistic combination of chemical and physical interactions with plasma-generated neutrals and ions that provide the anisotropic etch. The neutrals typically include a reactive species that form a volatile chemical reaction product with the substrate surface through openings in the mask layer while ions concurrently bombard the exposed substrate surface to increase the chemical reaction rate in the direction of ion impact. This increased reaction rate provides a greater material removal rate in the ion incidence direction than chemical reactions alone in other directions, thus providing an anisotropic etch process.

Typically, the increase in etch rate in the ion impact direction, and thus the degree of anisotropy of the etch process, is directly related to ion energy and angular distribution at the substrate surface, while the etch direction is determined by ion directionality. For example, an RIE process that produces high-energy ions with low angular distribution and nearly normal ion directionality to the substrate surface provides a highly anisotropic etch rate in the vertical direction (for a horizontally oriented substrate surface). Thus, achieving the uniform nearly vertical etch profiles often desired of high aspect ratio openings requires controlling ion energy, angular distribution, and ion directionality at and across the substrate surface.

Generally, ions are accelerated across the plasma sheath with a directionality perpendicular to the sheath boundary with the bulk plasma. The shape of the sheath boundary, and the directionality of the ions, are determined by the sheath thickness uniformity over the substrate surface and substrate adjacent surfaces. Ions impact the substrate surface with an energy and angular distribution determined within the plasma sheath. Some of the factors that may affect the ion energy and angular distribution include the time-averaged sheath voltage (time-averaged difference between the potentials of the plasma and the substrate surface), collisions within the sheath (increases with pressure), and ion transit time to the period of the applied RF bias waveform.

For example, in a typical RF-biased etch process, the sinusoidal waveform of the RF bias power introduces time-dependent oscillations in the sheath voltage at the RF power frequency. The oscillating sheath voltage results in the generally undesirable energy distribution function (IEDF), such as shown in FIG. 7A, where ions energies 701 at the substrate surface are distributed between a low energy peak 702, a high energy peak 704, and across an ion energy range 706 therebetween. When compared to the higher energy ions, lower energy ions have an undesirably wider angular distribution, result in reduced etch rates and anisotropy, and can be less effective at reaching the corners at the base surface of an opening, e.g., due to charging effects, but typically have desirably higher etch selectivity between the masking layer and the substrate material. The higher energy ions, in comparison to the lower energy ions, generally have a desirable narrower angular distribution, and increased etch rates and anisotropy, but also have an undesirable reduced etch selectivity between the masking layer and the substrate material. Thus, as processing requirements become increasingly stringent, the two-peak IEDF caused by an RF bias is increasingly problematic due to the diverging requirements of ion energy-dependent processing results.

Consequently, for at least the reasons discussed above, achieving desired uniform nearly vertical etch profiles in high aspect ratio openings requires controlling characteristics of the plasma sheath. Unfortunately, obtaining the level of sheath control needed to reliably form high aspect ratio openings for the next generation of semiconductor devices has proven problematic for conventionally configured plasma processing chambers.

Accordingly, there is a need in the art for apparatus and methods that provide improved control over characteristics of a plasma sheath formed over a semiconductor substrate during the plasma-assisted processing of the semiconductor substrate.

SUMMARY

Embodiments herein provide plasma processing chambers and methods configured for fine-tuning and control over a plasma sheath formed during the plasma-assisted processing of a semiconductor substrate.

In one embodiment, a plasma processing system is provided. The plasma processing system may include: a plurality of biasing pixels configured to adjust one or more characteristics of plasma sheath formed between a substrate support and a plasma, where each of the biasing pixels may include one or more bias electrodes of a plurality of bias electrodes disposed in a dielectric body of a substrate support, the plurality of bias electrodes are spaced apart from surfaces of the substrate support and from one another, and the dielectric body is formed to define a substrate supporting surface, and a bias module may include a plurality of waveform generators, where each waveform generator of the plurality of waveform generators is electrically coupled to a respective biasing pixel of the plurality of biasing pixels, each of the plurality of waveform generators are configured to establish a pulsed voltage (PV) waveform at the respective biasing pixel, and each of the plurality of waveform generators are independently controllable so that one or more characteristics of at least one of the established PV waveforms can be adjusted relative to the one or more characteristics of other ones of the established PV waveforms.

In one embodiment, a plasma processing system is provided. The plasma processing system may include: a plurality of biasing pixels configured to adjust one or more characteristics of plasma sheath formed between a substrate support and a plasma, where each of the biasing pixels may include one or more bias electrodes of a plurality of bias electrodes disposed in a dielectric body of a substrate support, the plurality of bias electrodes are spaced apart from surfaces of the substrate support and from one another, the dielectric body is formed to define a substrate supporting surface, and the plurality of biasing pixels may include a plurality of substrate biasing pixels disposed a distance from the substrate supporting surface; and a bias module may include a plurality of waveform generators, where each waveform generator of the plurality of waveform generators is electrically coupled to a respective biasing pixel of the plurality of biasing pixels, each of the plurality of waveform generators are configured to establish a pulsed voltage (PV) waveform at the respective biasing pixel, and each of the plurality of waveform generators are independently controllable so that one or more characteristics of at least one of the established PV waveforms can be adjusted relative to the one or more characteristics of other ones of the established PV waveforms.

In another embodiment, a plasma processing method is provided. The method may include igniting and maintaining a plasma from gases or vapors delivered to a processing region, where the processing region is defined by a chamber lid and a substrate support facing the chamber lid, the substrate support may include: a dielectric body having a substrate supporting surface; and a plurality of biasing pixels arranged to adjust one or more characteristics of a plasma sheath formed between the substrate support and the plasma, each of the plurality of biasing pixels may include one or more bias electrodes of a plurality of bias electrodes disposed in the dielectric body, where the plurality of bias electrodes are spaced apart from one another and surfaces of the substrate support, each of the plurality of biasing pixels are electrically coupled to a corresponding one of a plurality of pulsed voltage PV waveform generators, and the plurality of biasing pixels may include a plurality of substrate biasing pixels disposed a distance from the substrate supporting surface; and establishing, by use of the plurality of waveform generators, a respective pulsed voltage waveform at each of the plurality of biasing pixels, where one or more characteristics of at least one of the established pulsed voltage waveforms is different from characteristics of one or more of the other established pulsed voltage waveforms.

In another embodiment, a plasma processing system is provided. The plasma processing system may include a substrate support assembly having a support base and a substrate support disposed on the support base, the substrate support having a dielectric body formed to define a substrate supporting surface and a plurality of first electrodes disposed in the dielectric body between the substrate supporting surface and the support base. The plasma processing system may also include a bias module having a plurality of first waveform generators, each coupled to one or more of the plurality of first electrodes, where each of the plurality of first waveform generators is configured to establish a pulsed voltage (PV) waveform at the one or more first electrodes electrically coupled thereto, and each of the plurality of first waveform generators is independently controllable so that one or more characteristics of a PV waveform established by one of the plurality of first waveform generators can be adjusted relative to one or more characteristics of the PV waveforms established by other ones of the plurality of first waveform generators. Other embodiments include the substrate support assembly having local heating and/or cooling capabilities with independent and local control of the temperature within discrete regions across the surface of the substrate support. Other embodiments include the substrate support assembly having a switching network, the switching network having switches connected between the first electrodes and the bias module.

In another embodiment, a substrate processing system is provided. The substrate processing system may include a plurality of biasing pixel groups configured to adjust one or more characteristics of plasma sheath formed between a substrate support and a plasma, where each of the biasing pixel groups may include one or more bias electrodes that are disposed in a dielectric body of a substrate support, the one or more bias electrodes are spaced apart from a substrate supporting surface of the substrate support and from one another, the dielectric body is formed to define the substrate supporting surface. The substrate processing system may include a bias module that may include a plurality of waveform generators, where each waveform generator of the plurality of waveform generators is electrically coupled to a respective biasing pixel group of the plurality of biasing pixel groups, each of the plurality of waveform generators is configured to establish a pulsed voltage (PV) waveform at the respective biasing pixel group, and each of the plurality of waveform generators are independently controllable so that one or more characteristics of at least one of the established PV waveforms can be adjusted relative to the one or more characteristics of other ones of the established PV waveforms.

In another embodiment, a plasma processing method is provided. The method may include (a) positioning a substrate on a substrate support disposed in a processing volume of a processing chamber, the substrate support comprising a dielectric body and a plurality of first electrodes, where the substrate is positioned on a substrate supporting surface defined by the dielectric body and the plurality of first electrodes are disposed beneath the substrate and are spaced apart therefrom by a portion of the dielectric body, and (b) igniting and maintaining a plasma from gases or vapors delivered to the processing volume, and (c) differently biasing one or more regions of the substrate by establishing, by use of a plurality of first waveform generators, pulsed voltage waveforms at individual ones or groups of the plurality of first electrodes, where one or more characteristics of a pulsed voltage waveform established at at least one first electrode are different from one or more characteristics of pulsed voltage waveforms established at one or more other ones of the plurality of first electrodes. Other embodiments include corresponding computer systems, apparatus, and computer programs recorded on one or more computer storage devices, including non-transitory computer readable non-transitory medium, each configured to perform the method.

In another embodiment, a plasma processing system is provided. The plasma processing system may include a signal detection module configured to receive electrical signals from a plurality of first biasing circuits, each of the first biasing circuits having one or more first electrodes of a plurality of first electrodes disposed in a dielectric body of a substrate support, where the plurality of first electrodes are disposed beneath a substrate supporting surface of the dielectric body, a first waveform generator of a plurality of first waveform generators each configured to establish a pulsed voltage waveform at the one or more first electrodes, and a first transmission line of a plurality of first transmission lines, the first transmission line electrically coupling the first waveform generator to the one or more first electrodes, where each of the plurality of first waveform generators is configured to establish a pulsed voltage waveform at the one or more first electrodes electrically coupled thereto. The plasma processing system may include a non-transitory computer-readable medium having instructions for performing a method of determining, based on an analysis of the electrical signals received by the signal detection module, one or more characteristics of a plasma or a plasma sheath formed between the substrate support and a chamber lid.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

FIG. 2C is a schematic plan view of a substrate support assembly, according to another embodiment, which may be used with any one of the plasma processing chambers in FIGS. 1A-1C.

FIG. 2D is a sectional view of a portion of the support assembly of FIG. 2B and a simplified schematic diagram of a bias module, according to another embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
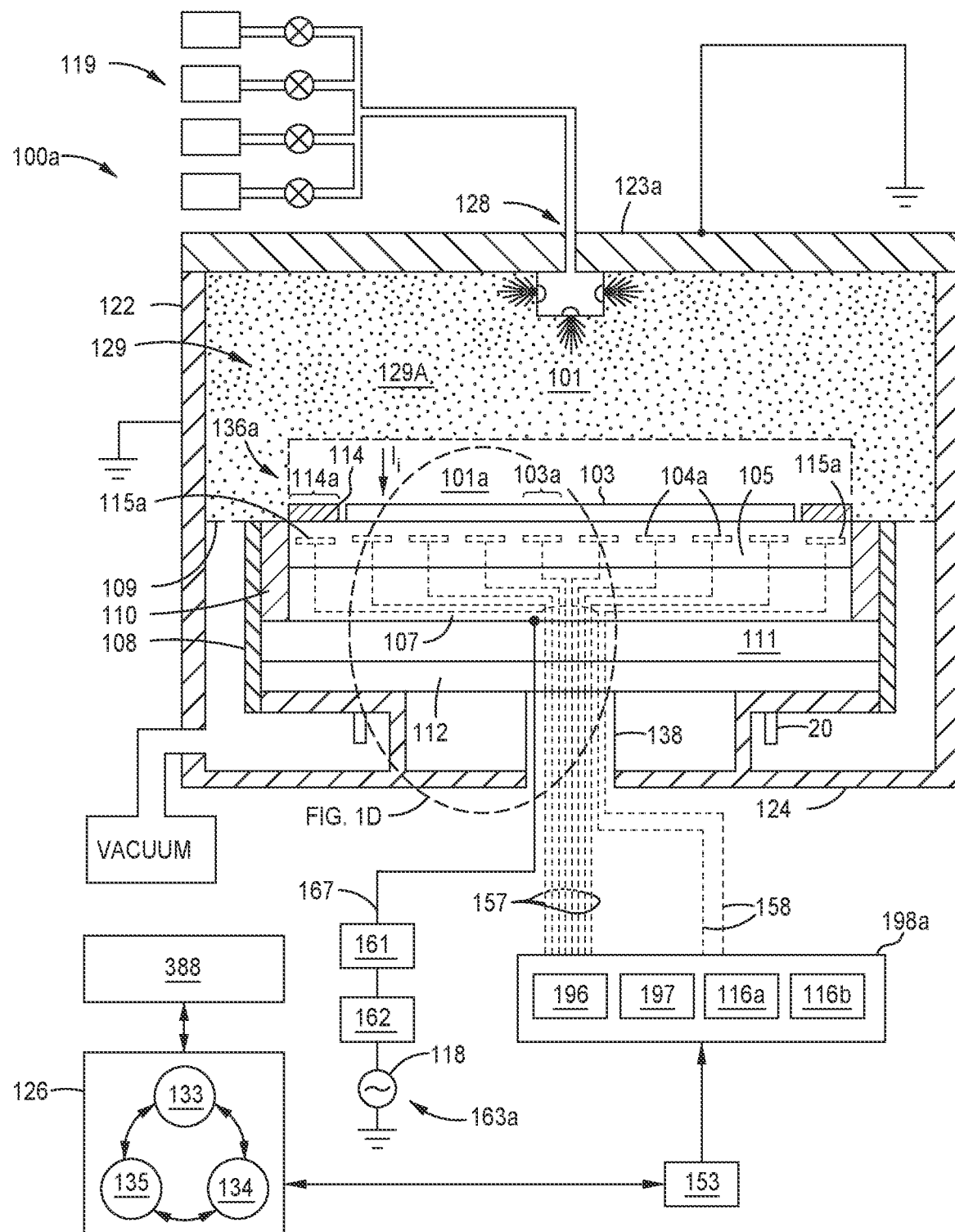
FIGS. 1A-1C are schematic sectional views of plasma processing chambers, according to one or more embodiments, configured to practice the methods set forth herein.

Embodiments described herein are generally directed to plasma processing chambers configured for the plasma-assisted processing of a semiconductor substrate. Embodiments include a sheath tuning scheme, including plasma processing chambers and methods, which can be used to tailor one or more characteristics of a plasma sheath formed between a bulk plasma and a substrate surface. In some embodiments, the sheath tuning scheme is used to determine and adjust one or more characteristics of a plasma sheath formed during a plasma-assisted etch process. The sheath tuning scheme disclosed herein can thus be used to adjust and/or control the directionality, and energy and angular distributions of ions that bombard a substrate surface during a plasma-assisted etch process.

Generally, the sheath tuning scheme provides differently configured pulsed voltage (PV) waveforms to a plurality of bias electrodes embedded beneath the surface of a substrate support in an arrangement where each of the electrodes can be used to differentially bias a surface region of a substrate positioned on the support. Embodiments of the sheath tuning scheme can be used for improved local, azimuthal, and lateral control over sheath characteristics with respect to the substrate surface. The improved control over sheath characteristics facilitates local, radial, and lateral tuning of ion energy, angular distribution, and directionality at the substrate surface. Thus, the sheath tuning scheme may be used to advantageously provide substantially uniform processing conditions across the substrate surface, resulting in improved within-substrate processing result uniformity. In some embodiments, the sheath tuning scheme is used to provide differential processing conditions for one or more regions of the substrate surface, e.g., to adjust for within-substrate nonuniformities caused by upstream substrate processing operations, expected nonuniformities caused by downstream processing operations, or both.

In some embodiments, the plurality of bias electrodes are disposed in an electrostatic chuck (ESC) used to support and secure the substrate during processing, e.g., a substrate support. In some embodiments, the plurality of PV waveforms are delivered from a plurality of PV waveform generators that are electrically coupled to the plurality of bias electrodes disposed within the support assembly. In some embodiments, the plurality of electrodes are configured as chucking electrodes, and a PV waveform source includes the PV waveform generator and a clamping network that is used to "clamp" or "chuck" a substrate to the substrate support, e.g., by generating an electrostatic attraction therebetween.

In embodiments herein, each of the plurality of PV waveforms is configurable to establish a nearly constant sheath voltage (constant difference between the plasma potential the substrate potential) at the corresponding region of the substrate surface. Herein, each of the plurality of PV waveforms is independently configurable, e.g., to have different pulse voltage levels (i.e., peak-to-peak voltage levels ($V_{pp}$)), different pulse duty cycles, different ion current phase duty cycles, and/or different pulse frequencies that can be used individually or collectively to provide a desired sheath thickness profile across the substrate surface. The sheath thickness profile determines the shape of a sheath boundary between a sheath and a bulk plasma, and thus the directionality of ions accelerated towards the substrate surface regions disposed there below. In some embodiments, the plurality of electrodes are arranged in a repeating pattern (when viewed from top-down) of similarly shape and sized electrodes, where each electrode is an individually controllable biasing element of the sheath tuning scheme. In some embodiments, a biasing pixel comprises a group of more than one electrode electrically coupled to an individual one of the plurality of PV waveform generators, such as a group of electrodes that correspond to a zone, a sector or quadrant of the substrate support surface.

In some embodiments, the sheath tuning scheme further includes one or more edge bias electrodes that can be used to bias plasma-facing surfaces adjacent to the substrate (substrate adjacent surfaces), such as an edge ring that surrounds the substrate. Typically, one or more PV waveforms are respectively delivered to the one or more edge bias electrodes to facilitate adjustment and control over the portion of the plasma sheath that extends outwardly from the peripheral edge of the substrate. In some embodiments, a plurality of edge bias electrodes are disposed in a group of biasing pixels-type arrangement to extend the local, azimuthal, and lateral adjustment capabilities of the sheath tuning scheme to portions of the sheath disposed outwardly of the peripheral edge of the substrate. Beneficially, the plurality of edge bias electrodes and the PV waveforms delivered thereto can be used to tune sheath characteristics outwardly from the substrate edge, e.g., to prevent or reduce undesirable bending of the sheath boundary and non-uniform processing results from differences in the directionality of ions accelerated from a bent portion of the sheath boundary.

Exemplary processing systems that may be used to perform the methods are described below. The example processing systems are generally suitable for use in plasma-assisted etching processes, such as reactive ion etch (RIE) processes. However, it should be noted that the sheath tuning schemes herein may be used in any plasma processing system where improved control over one or more sheath characteristics is desired. For example, embodiments of the present disclosure may also be used with processing systems configured for use with plasma-enhanced chemical vapor deposition (PECVD) processes, plasma-enhanced physical vapor deposition (PEPVD) processes, plasma-enhanced atomic layer deposition (PEALD) processes, plasma treatment processing, or plasma-based ion implant processing, for example, plasma doping (PLAD) processing.

Plasma Processing Chamber Examples

Figure 1B:
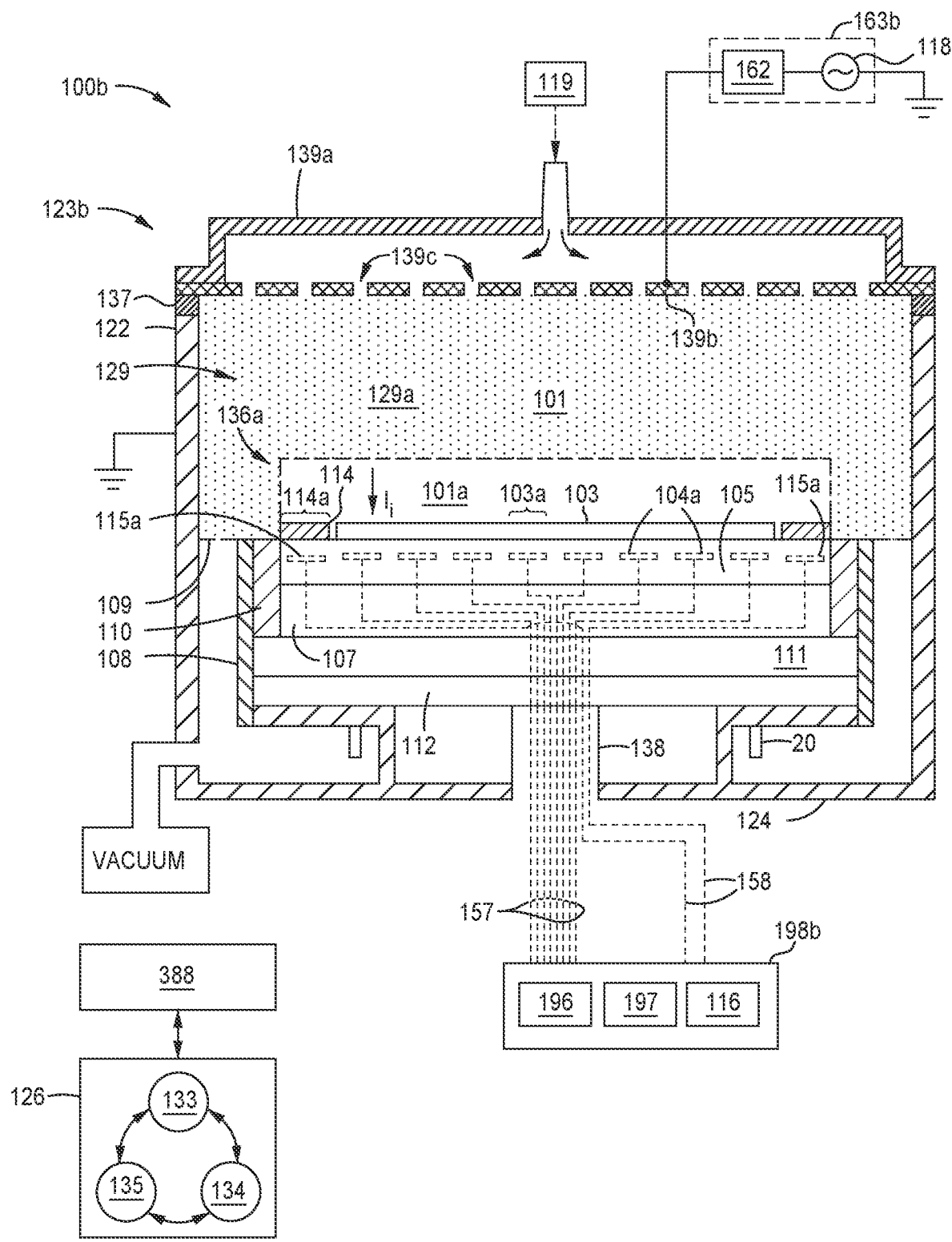
Figure 1C:
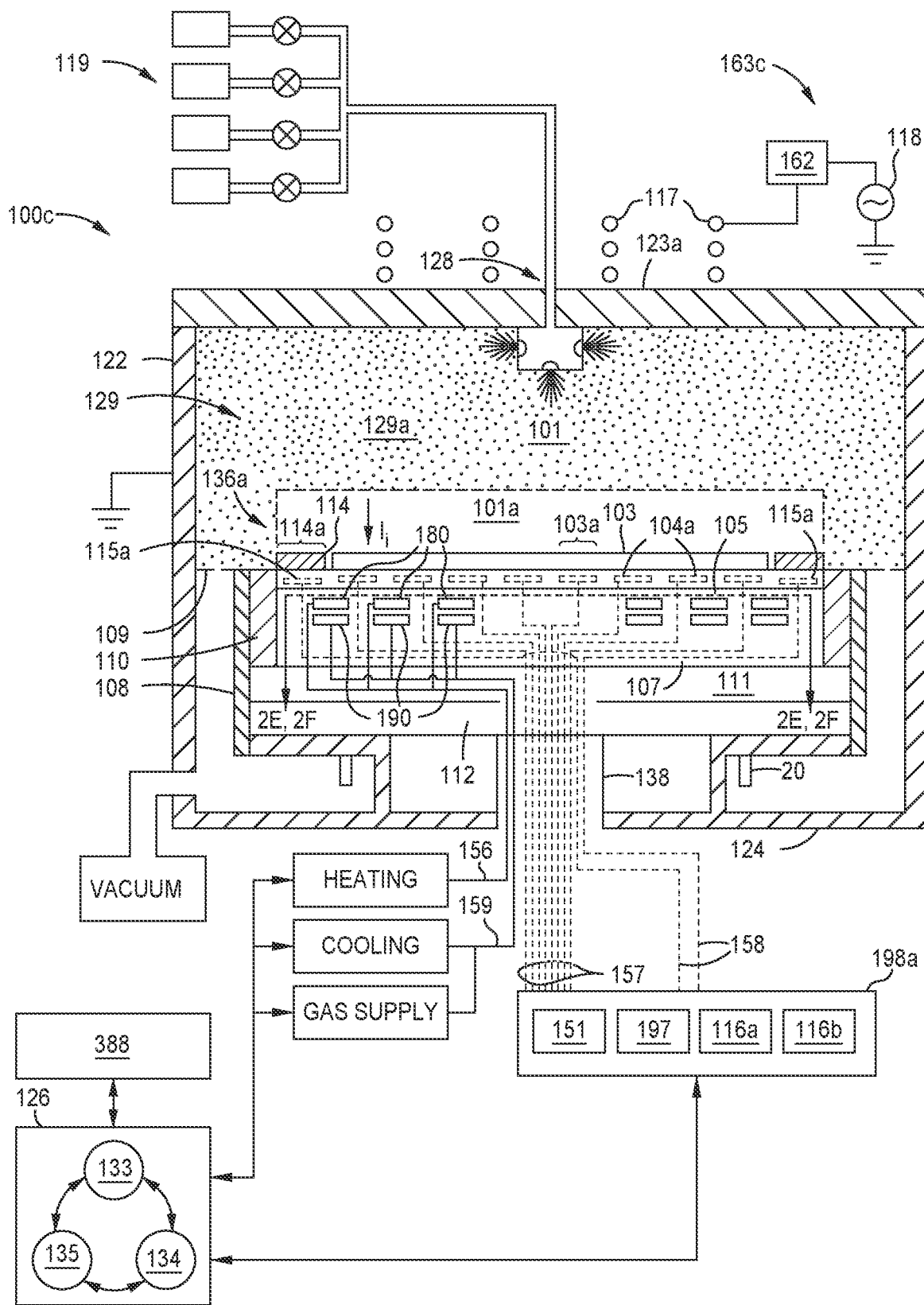

FIGS. 1A-1C schematically illustrate examples of processing chambers that may be used as part of a sheath tuning scheme to practice the methods described below. The sheath tuning scheme may be implemented using a processing chamber configured to form a capacitively coupled plasma (CCP), such as processing chamber 100a or processing chamber 100b of FIGS. 1A and 1B, respectively, or a processing chamber configured to form an inductively coupled plasma (ICP), such as processing chamber 100c of FIG. 1C, or with any other type of in-situ plasma system where local, azimuthal, and lateral control over one or more characteristics of a plasma sheath is desired.

For the processing chambers 100a, 100b, a plasma 101 is formed in a chamber volume 129 through capacitive coupling with at least one of an upper electrode (e.g., chamber lid 123a, 123b) and a lower electrode (e.g., support assembly 136a) which define a processing region 129a. The plasma 101 is generated through excitation of processing gases in the processing region 129a using a radio-frequency (RF) power delivered to one of the upper or lower electrodes, e.g., a "power electrode" or "cathode," from an RF power source, where the other electrode of the upper or lower electrodes is coupled to ground or a second RF power source. Generally, the sizes, shapes, and relative arrangements of the upper and lower electrodes, and the resulting distribution of the RF power used to generate the plasma therebetween, as well as processing conditions, such as temperature and pressure, directly affect plasma density (e.g., number of free electrons/cm$^3$) and plasma density uniformity within the processing region 129a. Plasma density and density uniformity determine ion and neutral flux across the surface of a substrate 103 and influence characteristics of a plasma sheath 101a formed thereover. Beneficially, the sheath tuning schemes disclosed herein enable adjustments to sheath characteristics, such as the sheath thickness profile, that can be made independent of the distribution of plasma density.

In FIG. 1A, the processing chamber 100a includes a chamber lid 123a, one or more sidewalls 122, and a chamber base 124 that collectively define a chamber volume 129, a support assembly 136a (shown in profile) disposed in the chamber volume 129, a plasma generator assembly 163a, a bias module 198a, one or more optional timing and triggering circuits 153, a signal detection module 388, for example a signal trace module, and a system controller 126. During processing, the chamber volume 129 is maintained at sub-atmospheric conditions using a vacuum source, such as one or more vacuum pumps (not shown) fluidly coupled to the processing chamber 100a, which evacuates processing gases and gaseous by-products therefrom. Processing gases are delivered from a processing gas source 119 through a gas inlet 128 disposed through the chamber lid 123a (as shown) or through a gas inlet disposed through one of the one or more sidewalls 122. The processing gases are used to form a plasma 101 in a processing region 129a that is defined by the chamber lid 123a and the support assembly 136a.

The support assembly 136a is disposed on a support shaft 138 that sealingly extends through the chamber base 124, the generally includes a support base 107 and a substrate support 105 disposed on the support base 107. The support base 107 is electrically coupled to the plasma generator assembly 163a, which delivers an RF power used to ignite and maintain the plasma 101. Here, the plasma generator assembly 163a includes an RF power supply 118 that is electrically coupled to the support base 107 via an RF matching circuit 162 and a first filter assembly 161. The first filter assembly 161 includes one or more electrical elements that are configured to substantially prevent a current generated by the output of PV waveform generators 150 from flowing through a transmission line, e.g., the RF power delivery line 167, and damaging the RF power supply 118. The first filter assembly 161 acts as a high impedance (e.g., high Z) to the PV signal generated from a PV pulse generator within the PV waveform generator 150, and thus inhibits the flow of current to the RF matching circuit 162 and RF power supply 118. In other embodiments, the plasma generator assembly 163a is configured to deliver an RF power to one or more of the plurality of first electrodes 104a disposed in the substrate support 105 versus to the support base 107.

Generally, the support base 107 is formed of a corrosion-resistant thermally conductive material, such as a corrosion-resistant metal, for example aluminum, an aluminum alloy, or stainless steel, and is coupled to the substrate support 105 with an adhesive or by mechanical means. In some embodiments, the support base 107 is configured to regulate the temperature of the substrate support 105, and may include one or more heating channels and or cooling channels (shown in FIG. 1C, and discussed below) in fluid communication with a heat source or coolant source, such as a refrigerant source or water source having a relatively high electrical resistance. In some embodiments, the substrate support 105 includes a resistive heater (not shown), such as a resistive heating element embedded in the dielectric material thereof.

In some embodiments, at least portions of the support assembly 136a are surrounded by a dielectric collar 110 (shown in cross-section), e.g., a quartz pipe, which protects the support assembly 136a from contact with corrosive processing gases, cleaning gases, plasmas, and/or by-products formed thereof. Here, the support assembly 136a is disposed on an insulator plate 111 (shown in profile), which electrically isolates the support assembly 136a from a ground plate 112 (shown in profile) disposed there beneath. As shown, the dielectric collar 110, the insulator plate 111, and the ground plate 112 are circumscribed by a liner 108. In some embodiments, a plasma screen 109 is positioned between the liner 108 and the sidewalls 122 to prevent plasma from forming in a volume space defined by the plasma screen 109, the liner 108, and the one or more sidewalls 122.

Typically, substrates are loaded into and removed from the chamber volume 129 through an opening (not shown) formed through one of the one or more sidewalls 122, which is sealed with a valve or a door (not shown) during plasma processing. Substrate transfer to and from the substrate support 105 is facilitated an actuator assembly (not shown) configured to raise and lower a plurality of lift pins 20 that are movably disposed through openings 21 (FIGS. 2A, 2B) formed through the support assembly 136a. In a raised position (not shown), the plurality of lift pins 20 extend above the substrate supporting surface 105a to lift a substrate from the substrate supporting surface 105a for access by a robot handler (not shown). When lowered, as shown here, the plurality of lift pins 20 retract beneath the substrate supporting surface 105a, and the substrate 103 is positioned thereon.

Figures 2A, 2B:
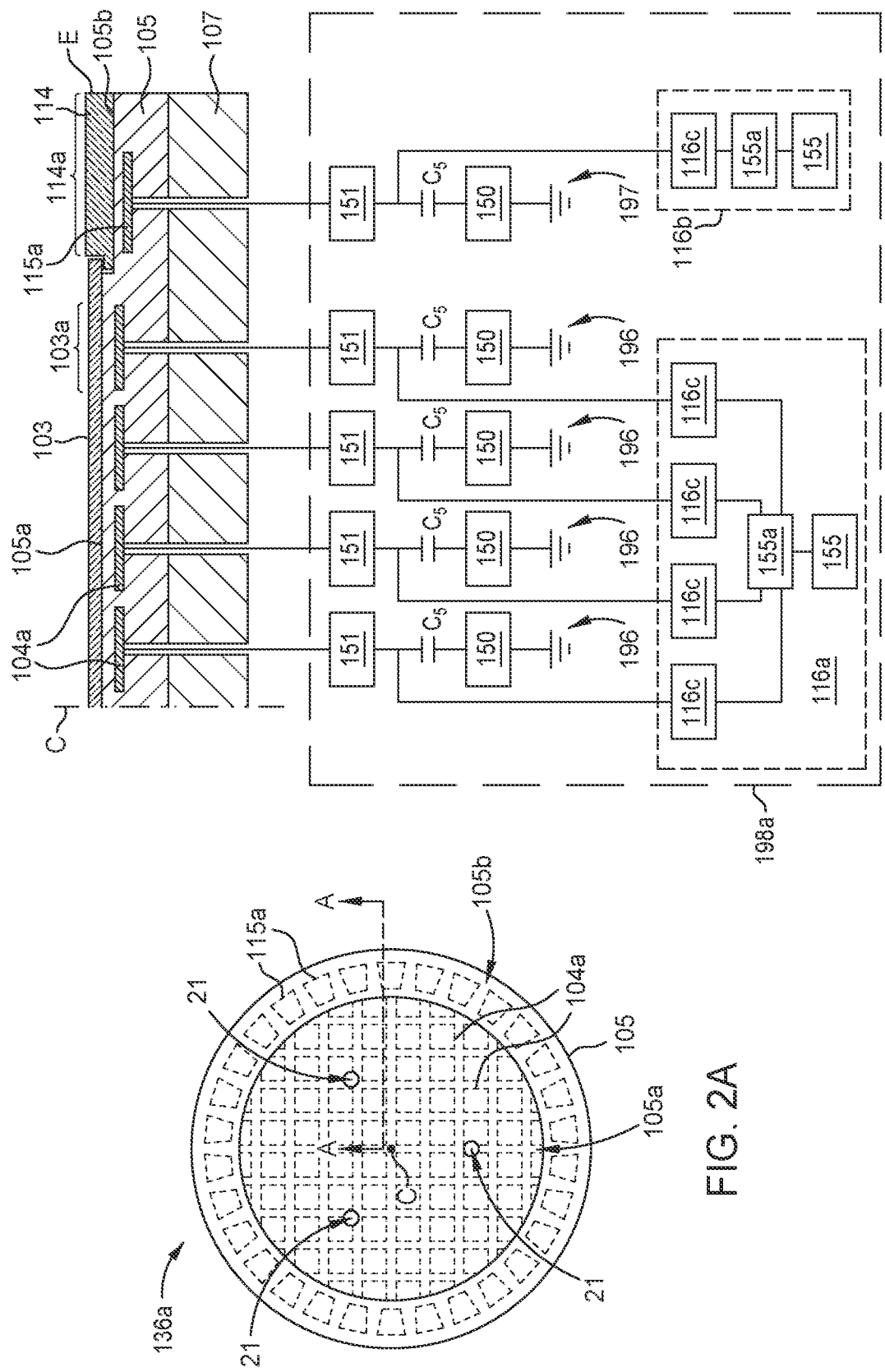
FIG. 2A is a schematic plan view of a substrate support assembly, according to one embodiment, which may be used with any one of the plasma processing chambers in FIGS. 1A-1C.
FIG. 2B is a sectional view of a portion of the support assembly of FIG. 2A and a simplified schematic diagram of a bias module coupled to the support assembly, according to one embodiment.
Figure 3:
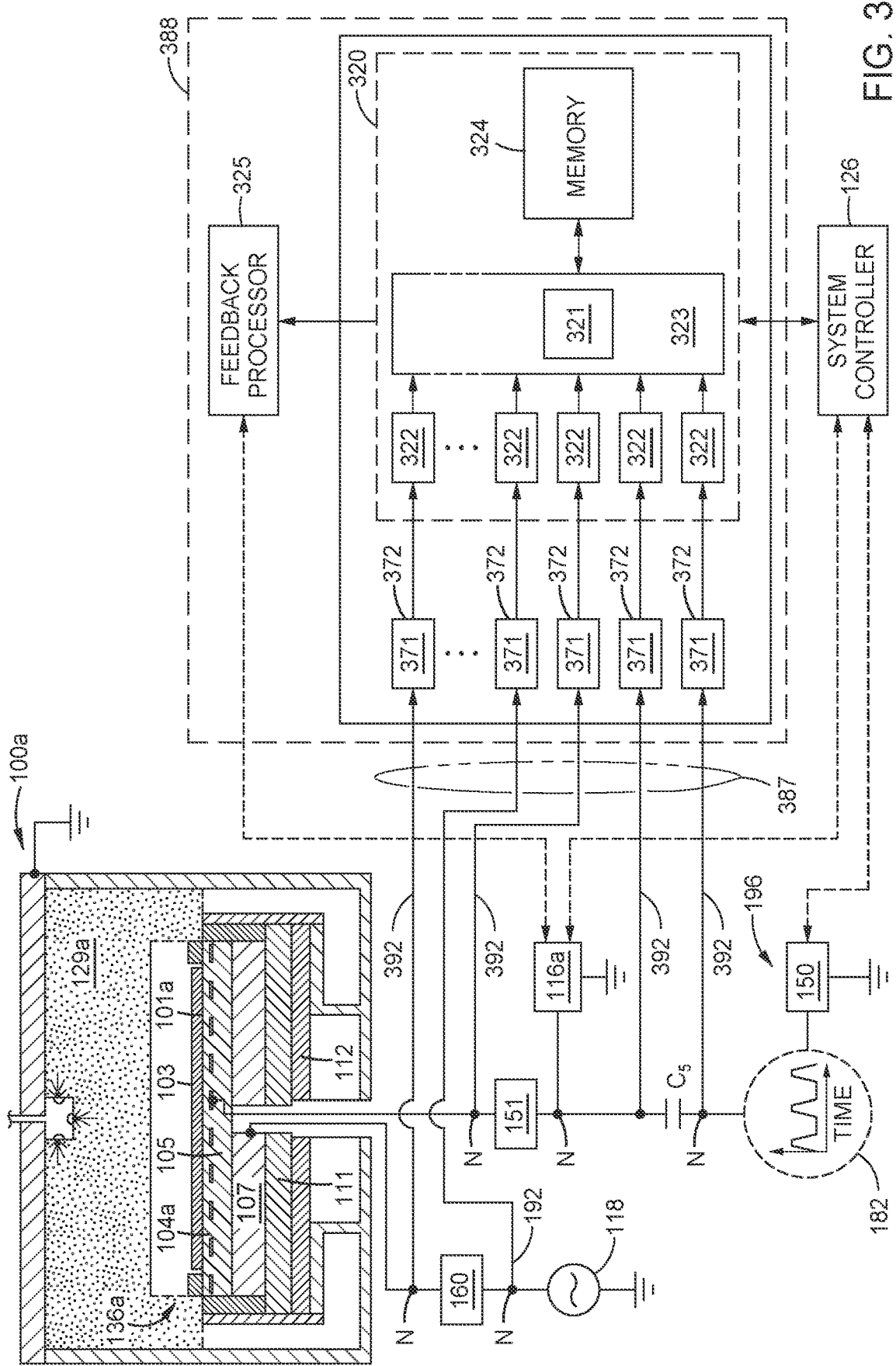
FIG. 3 is a simplified schematic sectional view of the processing chamber of FIG. 1A and a signal detection module, according to one embodiment, that may be used with any of the plasma processing chambers in FIGS. 1A-1C.

The signal detection module 388 is electrically coupled to one or more electrical components of the processing chamber 100a by use of a plurality of signal lines 387 (shown in FIG. 3). The signal detection module 388 is configured to receive electrical signals that may be used to determine one or more characteristics of the plasma sheath 101a and communicate information relating to the one or more sheath characteristics to the system controller 126. A more detailed description of the support assembly 136a, the bias module 198a, and the signal detection module 388 can be found in relation to FIGS. 2A-2D and 3 below.

Operation of the processing chamber 100a and performance of the methods herein are facilitated by the system controller 126. The system controller 126 includes a central processing unit, here the CPU 133, memory 134, and support circuits 135. The CPU 133 is a general-purpose computer processor configured for use in an industrial setting for controlling the processing chamber and sub-processors related thereto. The memory 134 is generally non-volatile memory, such as non-transitory computer-readable medium, and may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing chamber 100a. Typically, the program, which is readable by CPU 133 in the system controller 126, includes code, which, when executed by the CPU 133, performs tasks relating to the sheath tuning schemes described herein. The program may include instructions that are used to control the various hardware and electrical components within the processing chamber 100a to perform the various process tasks and various process sequences used to implement the methods described herein.

As described above, the processing chamber 100a is configured to generate a capacitively coupled plasma using an RF power delivered to a lower electrode, i.e., the support assembly 136a, from a plasma generator assembly 163a electrically coupled to the support base 107. In other embodiments, such as shown in FIG. 1B, the processing chamber 100b is configured to generate a capacitively coupled plasma using an RF power delivered an upper electrode, i.e., the chamber lid 123b.

In FIG. 1B, the processing chamber 100b is similarly configured to the processing chamber 100a and includes the chamber lid 123b, one or more sidewalls 122, the chamber base 124, the support assembly 136a, a plasma generator assembly 163b, a bias module 198b the signal detection module 388, and the system controller 126. The chamber lid 123b is electrically isolated from the one or more sidewalls 122 by a lid insulator 137 disposed therebetween. Here, the chamber lid 123b includes a lid plate 139a and a showerhead 139b coupled to the lid plate 139a, where the showerhead 139b, the one or more sidewalls 122, and the chamber base 124 collectively define the chamber volume 129. Processing gases from the processing gas source 119 are distributed into the chamber volume 129 through openings 139c in the showerhead 139b, which is electrically coupled to the plasma generator assembly 163b. The support base 107 may be electrically coupled to ground, e.g., through a grounded support shaft 138 (as shown) or a second RF source (not shown). Here, the plasma 101 is formed in the processing region 129a, which is defined by the support assembly 136a and the showerhead 139b by use of an RF power delivered to the showerhead 139b from the plasma generator assembly 163b. In some embodiments, the processing chamber 100b does not include a showerhead, and the RF power is delivered to the lid plate 139a.

In some embodiments, the sheath tuning scheme is implemented using a processing chamber configured to form an inductively coupled plasma (ICP), such as the processing chamber 100c. As shown in FIG. 1C, the processing chamber 100c includes the chamber lid 123a, one or more sidewalls 122, and the chamber base 124, which collectively define the chamber volume 129. The processing chamber 100c further includes the support assembly 136a, a plasma generator assembly 163c, the bias module 198a, the signal detection module 388, and the system controller 126. Processing gases or vapors are delivered to a processing region 129a (defined by the chamber lid 123a and the support assembly 136a) from the processing gas source 119. Here, the plasma generator assembly 163c is used to ignite and maintain the plasma 101 of the processing gases or vapors by RF-generated magnetic and electric fields. The plasma generator assembly 163c includes one or more inductive coils 117, which are electrically coupled to an RF power supply 118 via an RF matching circuit 162. The plasma 101 is generated by inductively coupling energy from the inductive coils 117 (powered by the RF power supply 118) into processing gases and/or vapors disposed in the processing region 129a.

In some embodiments, such as shown in FIG. 1C, the sheath tuning and processing uniformity results can be further controlled or adjusted using a substrate support assembly that further includes local heating and/or cooling capabilities. Independent and local control of the temperature within discrete regions across the surface of the support assembly 136a can enable azimuthal tuning of the temperature profile, center to edge tuning of the temperature profile, and reductions of local temperature variations, such as hot and cool spots. Support assembly 136a, as described above, may in some embodiments, further include heating channels 180 and/or cooling channels 190 to further refine the temperature control of the substrate 103 during processing. The heating channels 180 are positioned in the support base 107 and below the RF electrodes 104a and 115a. In one embodiment, a heated fluid is delivered from a heating fluid source through heating conduits 156 and circulated through heating channels 180. The heating channels 180 may be arranged in patterns that provide for sectional or regional heating across the support assembly 136 as further described with regards to FIGS. 2E and 2F below. Alternatively, in one embodiment, resistive heating elements (not shown) may be arranged in patterns and used to heat the substrate assembly in place of the heating channels 180. The heated fluid or resistive heating elements may be capable of heating the substrate supporting surface of the support assembly 136a and substrate 103 to a temperature of between 50° C. and 400° C.

In one embodiment, cooling channels 190 may be provided in the support base 107. In one embodiment the cooling channels may be positioned below the heating channels 180 in the support base 107. The cooling channels 190 provides for rapid cooling or improved thermal control of the temperature of the support assembly 136a before, during and after processing. The location of the cooling channels positioned below the heating channels and the RF electrodes 104a and 115a provides for further refined control of the temperature across the substrate during processing. A heat transfer fluid source such as a cooling liquid, gas or combination thereof, is circulated through the cooling channels 190 via cooling conduits 159. The cooling liquid or gas may be capable of cooling the substrate to a temperature of less than about 80° C. during processing. The cooling channels 180 may be arranged in patterns that provide for sectional or regional cooling across the support assembly 136a as further described with regards to FIGS. 2E and 2F below. The controller 126 may control the operation of the main heating source, cooling and cooling gas source, which may be set to heat or cool the substrate 134 to a predefined temperature.

As described below in relation to FIGS. 2A-2F and 3, the support assembly 136a, the bias module 198a, and the signal detection module 388 may be configured for use in any one of the processing chambers 100a, 100b, and 100c to provide for local, azimuthal, and lateral tuning of the plasma sheath 101a.

Support Assembly and Bias Module Examples

Figure 1D:
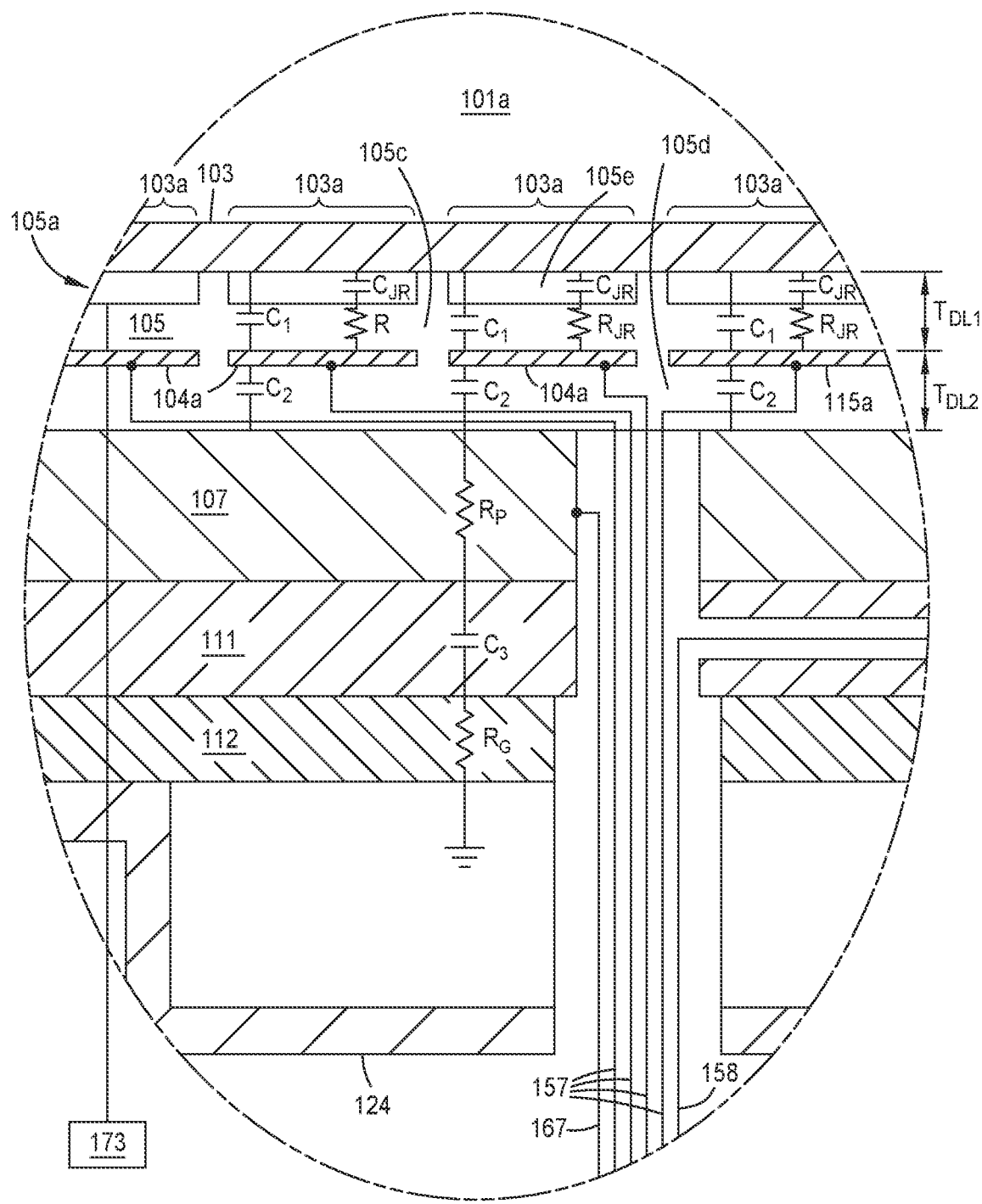
FIG. 1D is a close-up sectional view of a portion of the processing chamber shown in FIG. 1A.
Figure 1F:
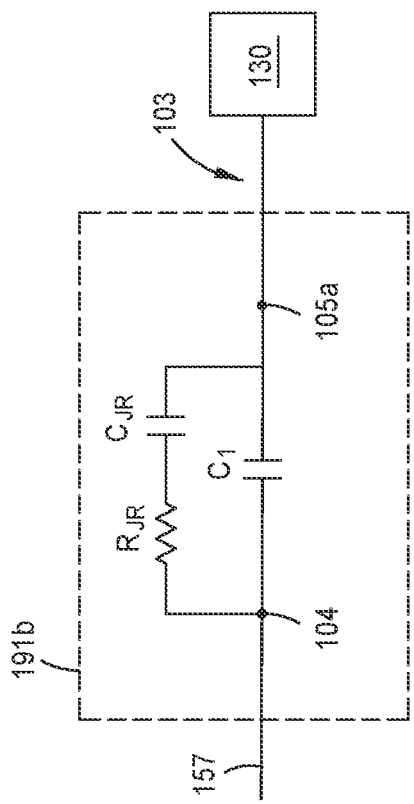
FIGS. 1E-1F are functionally equivalent circuit diagrams of different electrostatic chuck (ESC) types that may be used with any one of the processing chambers of FIGS. 1A-1C.
Figure 1E:
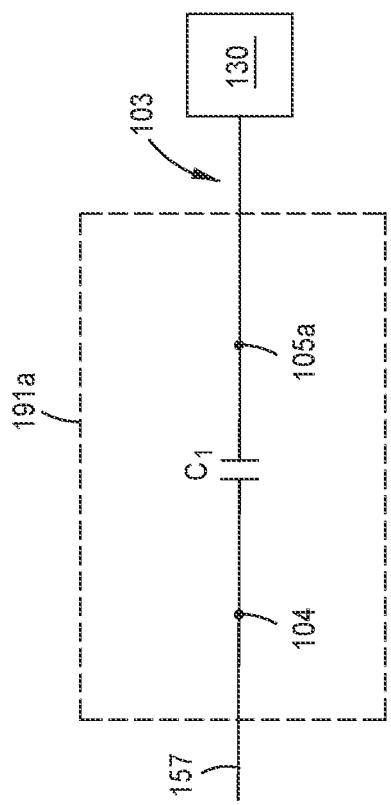

FIG. 1D is a close-up sectional view of a portion of the processing chamber 100a shown in FIG. 1A, which includes a simplified electrical schematic representation of the electrical characteristics of the various structural elements within the processing chamber 100a. The simplified electrical schematic illustrates known electrical characteristics of components of the processing chamber 100a that can be used by the signal detection module 388 or the system controller 126 to determine characteristics of the plasma sheath 101a, as discussed below in relation to FIG. 3. The discussion in relation to FIG. 1D is equally applicable to the processing chambers 100b, 100c of FIGS. 1B-1C, respectively. FIGS. 1E-1F are functionally equivalent circuit diagrams of different electrostatic chuck (ESC) types that can be used as the substrate support 105 of any one of the processing chambers of FIGS. 1A-1C. FIGS. 2A-2D illustrate example electrode arrangements and bias module configurations that can be used with any of the embodiments described herein.

As shown, the substrate support 105 is configured as an electrostatic chuck (ESC) and may be either one of a Coulombic type ESC or a Johnsen-Rahbek type ESC. Simplified equivalent circuit models 191a and 191b for a Coulombic ESC and a Johnsen-Rahbek ESC during plasma processing are illustrated in FIGS. 1E and 1F, respectively, and discussed below. Generally, in either ESC configuration of the substrate support 105, the substrate 103 is secured to the substrate support 105 by providing a potential between the substrate 103 the plurality of first electrodes 104a by use of the components in the bias module 198a, which results in an electrostatic attraction force therebetween. In some embodiments, the plurality of first electrodes 104a are also used to facilitate the sheath tuning schemes described herein. Generally, the substrate support 105 includes a dielectric material formed to define a substrate supporting surface 105a and the plurality of first electrodes 104a embedded in the dielectric material. The plurality of first electrodes 104a are spaced apart from the substrate supporting surface 105a, and thus the substrate 103, by a first dielectric material layer 105c, and from the support base 107, by a second dielectric material layer 105d. Here, the plurality of first electrodes 104a are spaced apart from one another portions of the dielectric material layers 105c, 105d, or by a void formed between the dielectric material layers 105c, 105d.

In some embodiments, the support assembly 136a may be configured to maintain the substrate 103 at a desired temperature by heating or cooling the substrate support 105, and thus the substrate 103 disposed thereon. Often, in those embodiments, the substrate supporting surface 105a is patterned to have raised portions (e.g., mesas) that contact the substrate 103 and recessed portions that define a gap region 105e with the substrate 103. During substrate processing, a gas source 173 fluidly coupled to the support assembly 136a delivers an inert gas, such as helium, to the gap region 105e, to improve heat transfer between the substrate supporting surface 105a and the substrate 103 disposed thereon. In some embodiments, the gas source 173 is used to deliver the inert gas to a region disposed between the edge ring 114 and an edge ring support surface 105b (shown in FIG. 2A) of the substrate support 105.

In some embodiments, each of the plurality of first electrodes 104a are electrically coupled to a DC power supply 155 (FIG. 2B) of the bias module 198a, which is configured to provide a potential between the substrate 103 and the plurality of first electrodes 104a and thus generate an electrostatic attraction (chucking force) therebetween. In some embodiments, the support assembly 136a is configured as one of a Coulombic ESC or a Johnsen-Rahbek ESC. A Johnsen-Rahbek ESC typically provides greater chucking forces and uses a lower chucking voltage when compared to the Coulombic type ESC. In the Coulombic ESC, the first dielectric material selected for the first dielectric material layer 105c will typically have a higher electrical resistance than a dielectric material selected for a Johnsen-Rahbek ESC, resulting in the differences in the simplified functionally equivalent circuit models 191a, 191b formed during plasma processing illustrated in FIGS. 1E and 1F respectively.

In the simplest case, e.g., the circuit model 191a for the Coulombic ESC shown in FIG. 1E, the first dielectric material layer 105c is formed of a dielectric material assumed to function as an insulator, e.g., having an infinite resistance $R_{JR}$, and the functionally equivalent circuit model 191a thus includes a direct capacitance $C_1$ between each of the plurality of first electrodes 104a and the substrate 103 through the first dielectric material layer 105c. In some embodiments of the Coulombic ESC, the dielectric material and thickness $T_{DL1}$ of the first dielectric material layer 105c are selected so that a sum of the individual capacitance $C_1$ between each of the plurality of first electrodes 104a and the substrate supporting surface 105a, is between about 5 nF and about 100 nF, such as between about 7 and about 20 nF. In some embodiments, the first dielectric material layer 105c is be formed of a ceramic material (e.g., aluminum oxide ($Al_2O_3$), etc.) and have a thickness $T_{DL1}$ between about 0.1 mm and about 1 mm, such as between about 0.1 mm and about 0.5 mm, for example, about 0.3 mm.

In the more complex case, such as illustrated in the circuit model 191b of the Johnsen-Rahbek ESC shown in FIG. 1F, the circuit model 191b includes a capacitance $C_1$ that is coupled in parallel with a dielectric material resistance $R_{JR}$ and gap capacitance $C_{JR}$. Typically, in a Johnsen-Rahbek ESC, the first dielectric material layer 105c is considered "leaky," in that it is not a perfect insulator and has some conductivity, since, for example, the dielectric material may be a doped aluminum nitride (AlN) having a permittivity (δ) of about 9. As with the circuit model 191a for the Coulombic ESC shown in FIG. 1D, there is a direct capacitance $C_1$ between each of the plurality of first electrodes 104a and the substrate 103 through the first dielectric material layer 105c and the gap region 105e filled with helium. The volume resistivity of the first dielectric material layer within a Johnsen-Rahbek ESC is less than about $10^{12}$ ohms-cm ($\Omega$-cm), or less than about $10^{10}$ $\Omega$-cm, or even in a range between $10^8$ $\Omega$-cm and $10^{12}$ $\Omega$-cm, and thus the dielectric material layer 105c can have a dielectric material resistance $R_{JR}$ in a range between $10^6$-$10^{11}$ $\Omega$s. In the circuit model 191b of FIG. 1F, a gap capacitance $C_{JR}$ is used to account for the gas-containing gap regions 105e between the substrate 103 and substrate supporting surface 105a. It is expected that the gap capacitance $C_{JR}$ has a capacitance a bit larger than the capacitance $C_1$.

Referring back to FIG. 1D, the electrical schematic representation of the circuit formed within the substrate support assembly 136a includes a second dielectric material layer capacitance $C_2$, which represents the capacitance of the second dielectric material layer 105d between each of the plurality of first electrodes 104a and the support base 107. In some embodiments, the thickness ($T_{DL2}$) of the portion of the second dielectric material layer 105d is greater than the thickness ($T_{DL1}$) of the first dielectric material layer 105c. In some embodiments, the dielectric materials used to form the dielectric layers on either side of the plurality of first electrodes 104a are the same material and form the structural body of the substrate support 105. In one example, the thickness ($T_{DL2}$) of the second dielectric material layer 105d (e.g., $Al_2O_3$ or AlN), as measured in a direction extending between the support base 107 and the plurality of first electrodes 104a, is greater than 1 mm, such as having a thickness between about 1.5 mm and about 100 mm. The sum of the individual second dielectric material layer capacitance $C_2$ (e.g., between each first electrode 104a and the support base 107) will typically have a capacitance between about 0.5 and about 10 nanofarads (nF).

The electrical schematic representation of the circuit formed within the substrate support assembly 136a, as shown in FIG. 1D, also includes a support base resistance $R_P$, an insulator plate capacitance $C_3$, and ground plate resistance $R_G$ that is coupled to ground on one end. Since the support base 107 and ground plate 112 are typically formed from a metal material, the support base resistance $R_P$ and ground plate resistance $R_G$ are quite low, such as less than a few milliohms. The insulator plate capacitance $C_3$ represents the capacitance of the dielectric layer positioned between the bottom surface of the support base 107 and the top surface of the ground plate 112. In one example, the insulator plate capacitance $C_3$ has a capacitance between about 0.1 and about 1 nF.

FIG. 2A is a schematic plan view of the support assembly 136a, which may be used with any one of the processing chambers described above. FIG. 2B is a schematic side cross-sectional view of the support assembly 136a taken along line A-A of FIG. 2A and further shows the bias module 198a coupled to the support assembly 136a, and the substrate 103 and edge ring 114, which are disposed on the support assembly 136a.

As shown, the support assembly 136a and the bias module 198a are configured to differentially bias a plurality of surface regions of a substrate 103 and an edge ring 114 that surrounds the substrate 103 using a plurality of pulsed voltage (PV) waveforms. The support assembly 136a includes a support base 107 and a substrate support 105 disposed on and thermally coupled to a support base 107. As discussed above, the substrate support 105 is typically formed of a dielectric material, such as a corrosion-resistant ceramic, that defines a substrate supporting surface 105a and an edge ring support surface 105b surrounding the substrate supporting surface 105a.

The substrate support 105 includes a plurality of first electrodes 104a disposed beneath and spaced apart from the substrate supporting surface 105a and one or more second electrodes 115a disposed beneath and spaced apart from the edge ring support surface 105b. In some embodiments, the plurality of first electrodes 104a are disposed in an arrangement that includes a repeating and/or non-random pattern (when viewed from top-down), such as a rectangular array (as shown), a hexagonal array, a polar array (e.g., as shown in FIG. 2C), concentric rings or ring segments, sectors or portions of sectors, quadrants, combinations thereof, or any other arrangement desired to differentially bias corresponding regions of a substrate disposed thereover. Individual ones of the plurality of first electrodes 104a may have any desired shape when viewed from top-down and can be sized and shaped so that a bias surface area provided by each of the first electrodes 104a is uniform across the substrate supporting surface 105a. In some embodiments, the shapes and/or sizes of the electrodes may change across the substrate supporting surface 105a, such as increasing or decreasing in size (surface area) in the radial direction or across a width of the substrate supporting surface 105a. In some embodiments, the plurality of first electrodes 104a are arranged in a repeating pattern of different shaped and/or sized electrodes.

The one or more second electrodes 115a can be of the same general sizes, shapes, and/or arrangements as described above in relation to the first electrodes 104a and generally include a plurality of second electrodes 115a arranged to at least partially surround the plurality of first electrodes 104a, such as the plurality of second electrodes 115a arranged in the polar array shown in FIG. 2A.

In some embodiments, such as shown in FIG. 2B, the plurality of first electrodes 104a are generally coplanar with one another. The one or more second electrodes 115a may be coplanar with one another and coplanar with the plurality of first electrodes 104a or positioned above or below a plane of the plurality of first electrodes 104a. Here, the plurality of first electrodes 104a and the one or more second electrodes 115a are embedded in the dielectric material of the substrate support 105 and may be formed by positioning desired sized and shaped conductive elements, such as metal foil, mesh, or plate between the first dielectric material layer 105c and the second dielectric material layer 105d when forming the substrate support 105. In some embodiments, the plurality of first electrodes 104a and/or the one or more second electrodes 115a are formed by plating, inkjet printing, screen printing, physical vapor deposition, stamping, wire mesh, or another suitable manner.

As shown in FIG. 2B, the bias module 198a includes a plurality of first PV modules 196 that are each electrically coupled to one of the plurality of first electrodes 104a and one or more second PV modules 197 that are each electrically coupled to one or more of the one or more second electrodes 115a. In some embodiments, the bias module 198a further includes a first clamping network 116a and a second clamping network 116b electrically coupled to the plurality of first electrodes 104a and the one or more second electrodes 115a, respectively, which are used to secure the substrate 103 and the edge ring 114 to the substrate support 105.

Here, the bias module 198a includes a plurality of first PV modules 196, one or more second PV modules 197, a first clamping network 116a, and a second clamping network 116b. As shown, each of the plurality of first PV modules 196 and each of the one or more second PV modules 197 are independently controllable, e.g., by use of the system controller 126, to deliver one or more differently configured PV waveforms to the plurality of first electrodes 104a or second electrodes 115. Individual electrodes 104a or electrode groups of the plurality of first electrodes 104a are electrically coupled to one of the plurality of first PV modules 196 and the first clamping network 116a by a corresponding transmission line, e.g., a first power delivery line 157. Individual electrodes 115a or electrode groups of the two or more second electrodes 115a are electrically coupled to one of the one or more second PV modules 197 and the second clamping network 116b by a corresponding transmission line, e.g., a second power delivery line 158.

In some embodiments, one or more of the plurality of first PV modules 196 includes a PV waveform generator 150 for establishing a pulsed voltage waveform at one or more of the plurality of first electrodes 104a, a first filter assembly 151 disposed between the PV waveform generator 150 and one or more of the plurality of first electrodes 104a, and a blocking capacitor $C_5$ disposed between the output of the PV waveform generator 150 and the first clamping network 116a. Generally, each of the one or more second PV modules 197 includes a PV waveform generator 150 for establishing a pulsed voltage waveform to one or more second electrodes 115a, a first filter assembly 151 disposed between the PV waveform generator 150 and the one or more second electrodes 115a, and a blocking capacitor $C_5$ disposed between the output of the PV waveform generator 150 and the second clamping network 116b.

In some embodiments, each of the plurality of first PV modules 196 is electrically coupled to an individual one of the plurality of first electrodes 104a or to a group of the plurality of first electrodes 104a. In those embodiments, the plurality of first PV modules 196 can be used to establish differently configured PV waveforms at the respective individual electrodes or groups of adjacent electrodes to differentially bias a corresponding substrate surface region 103a disposed thereover. Likewise, in some embodiments, each of the plurality of second PV modules 197 is electrically coupled to an individual one of the plurality of second electrodes 115a or to a group of the plurality of second electrodes 115a and can be independently controlled to differently bias corresponding edge ring surface regions 114a. As described below, differently configurable PV waveforms established at one or more electrodes 104a and 115a can be used to differently bias discrete substrate surface regions 103a or edge ring surface regions 114a to provide for the pixelated sheath tuning scheme described herein.

Generally, each of the differently configurable PV waveforms is configured to provide a nearly or constant sheath voltage during a substantial portion of the PV waveform cycle (e.g., "ion current stage" in FIG. 4A) that, in combination with the sheath thickness, enables the formation of a desirable ion energy distribution function (IEDF) at the surface of the substrate 103. As described in the methods below, the plurality of differently configurable PV waveforms can be used to adjust the thickness profile of a plasma sheath formed over a substrate surface and substrate adjacent surfaces during plasma processing. The ability to establish differently configured PV waveforms at each one or one or more groups of the plurality of electrodes 104a and 115a enables fine-tuning, control, and tailoring of processing results across the surface of the substrate 103.

During processing, a plurality of PV waveforms are provided to each of the plurality of first electrodes 104a and second electrodes 115a, and eventually to a complex load 130 within the processing chamber 100a, by a corresponding PV waveform generator 150 of the bias module 198a. The overall control of the delivery of the PV waveforms from each of the plurality of PV waveform generators 150 is controlled by use of signals provided from the signal detection module 388 and/or the system controller 126 as discussed below. In some embodiments, one or more timing and triggering circuits 153 are configured to synchronize portions of the pulsed voltage waveforms established at one or both of the plurality of substrate first electrodes 104a and the edge second electrodes 115a, or therebetween. In some embodiments, the one or more timing and triggering circuits 153 are configured to provide a desired offset to the beginnings of the voltage pulses of one or more of the pulsed voltage waveforms relative to other ones of the pulsed voltage waveforms applied between substrate first electrodes 104a, or between the plurality of edge second electrodes 115a, or between substrate first electrodes 104a and edge second electrodes 115a, such as to trigger asynchronous beginnings of the sheath collapse phase 450 and/or sheath formation phase 451 across different regions of the substrate 103 or substrate adjacent surfaces, e.g., the edge ring 114.

In some embodiments, the PV waveform generators 150 are configured to output a periodic voltage function at time intervals of a predetermined length, for example, by use of a signal from a transistor-transistor logic (TTL) source (not shown). The periodic voltage function generated by the transistor-transistor logic (TTL) source can be two-state direct current (DC) pulses between a predetermined negative or positive voltage and zero. In one embodiment, a PV waveform generator 150 is configured to maintain a predetermined, substantially constant negative voltage across its output (i.e., to ground) during regularly recurring time intervals of a predetermined length by repeatedly closing and opening one or more switches at a predetermined rate. In one example, during a first phase of a pulse interval a first switch is used to connect a high voltage supply to the electrodes 104a and/or 115a that are electrically coupled to the PV waveform generator 150, and during a second phase of the pulse interval a second switch is used to connect the electrodes 104a and/or 115a to ground. In another embodiment, the PV waveform generator 150 is configured to maintain a predetermined, substantially constant positive voltage across its output (i.e., to ground) during regularly recurring time intervals of a predetermined length by repeatedly closing and opening its internal switch (not shown) at a predetermined rate. In some embodiments, the PV waveform generators 150 are configured to provide a shaped pulse voltage waveform (not shown) having a non-zero slope, e.g., an upward positive slope and/or a downward negative slope in the ion current phase 452, by use of one or more internal switches and DC power supplies.

In one example configuration, during a first phase of a pulse interval a first switch is used to connect the electrodes 104a and/or 115a to ground, and during a second phase of the pulse interval a second switch is used to connect a high voltage supply to the electrodes 104a and/or 115a. In an alternate configuration, during a first phase of a pulse interval a first switch is positioned in an open state, such that the electrodes 104a and/or 115a are disconnected from the high voltage supply and is coupled to ground through an impedance network (e.g., inductor and resistor connected in series). Then, during a second phase of the pulse interval, the first switch is positioned in a closed state to connect the high voltage supply to the electrodes 104a and/or 115a, while the electrodes 104a and/or 115a remain coupled to ground through the impedance network.

The PV waveform generators 150 described herein may include a PV generator and one or more electrical components, such as but not limited to high repetition rate switches (not shown), capacitors (not shown), inductors (not shown), fly-back diodes (not shown), power transistors (not shown) and/or resistors (not shown), which are configured to provide a PV waveform to an output. A PV waveform generator 150, which can be configured as a nanosecond pulse generator, may include any number of internal components.

The first filter assembly 151 includes one or more electrical components configured to substantially prevent a current generated by the output of an RF power supply 118 from flowing through a power delivery line 157, 158 and damaging the PV waveform generator 150. The blocking capacitor $C_5$ protects the PV waveform generator 150 from the chucking voltage delivered to the plurality of substrate electrodes 104a from the first clamping network 116a or to the plurality of edge electrodes 115a form the second clamping network 116b. The connections to the clamping networks 116a, 116b can be optionally positioned between each of the first filter assemblies 151 and the plurality of substrate electrodes 104a or edge electrodes 115a, respectively.

As discussed above, in relation to FIGS. 1D-1F, one or more components of the bias module 198a, e.g., the first clamping network 116a and the second clamping network 116b, may be used to secure the substrate 103 to the substrate support 105. For example, as shown in FIG. 2B, the first clamping network 116a and the plurality of first electrodes 104a electrically coupled thereto secures the substrate 103 to the substrate supporting surface 105a by providing a potential between the substrate 103 and the plurality of first electrodes 104a. The potential results in an electrostatic attraction force between the substrate 103 and the plurality of first electrodes 104a that electrostatically clamps or "chucks" the substrate 103 to the substrate supporting surface 105a. Similarly, depending on the composition of the edge ring 114, the second clamping network 116b can be used to electrostatically clamp the edge ring 114 to the edge ring support surface 105b, e.g., to increase thermal contact and heat transfer therebetween. In some embodiments, the first and second clamping networks 116a, 116b each provide a static DC voltage, herein a "chucking voltage," in a range between about -5 kV and about 5 kV that is delivered to the plurality of first electrodes 104a or the one or more second electrodes 115a respectively coupled thereto.

Here, the first clamping network 116a includes a DC power supply 155, and a voltage divider 155a disposed between the DC power supply 155 and the plurality of first electrodes 104a. The voltage divider 155a comprises one or more electrical components, e.g., variable resistors and other circuit elements, configured to control the chucking voltage delivered to each of the plurality of first electrodes 104a. In some embodiments, the chucking voltage delivered to each of the plurality of first electrodes 104a can be adjusted to provide different voltages to different ones of the plurality of first electrodes 104a, e.g., to provide a desired distribution of clamping force between the substrate 103 and the substrate support 105. In some embodiments, each of the first PV modules 196 further includes a bias compensation circuit elements 116c disposed between the blocking capacitor $C_5$ and the voltage divider 155a. The bias compensation circuit elements 116c include electrical components, such as one or more blocking resistors, that form a current suppressing/filtering circuit for the PV waveform, so that a PV signal output from the PV waveform generator 150 does not induce a current through the DC power supply 155. The second clamping network 116b is similar in configuration to the first clamping network 116a and includes a DC power supply 155, and a voltage divider 155a disposed between the DC power supply 155 and the one or more second electrodes 115. In other embodiments, one or more of the plurality of first electrodes 104a are electrically coupled to individual ones of a plurality of clamping networks 116, such as shown in FIG. 2D.

FIG. 2C is a plan view of a support assembly 136a, according to another embodiment, that may be used with any of the processing chambers described herein. FIG. 2D is a sectional view of a portion of the support assembly 136a of FIG. 2C taken along line B-B and a schematic diagram of a bias module 198b that may be used to provide differently configurable PV waveforms and chucking voltages to respective electrodes of the plurality of electrodes 104a and 115a. As shown, the plurality of first electrodes 104a are arranged as individual segments of a plurality of annular rings concentrically disposed about a center C of the substrate supporting surface 105a and the one or more second electrodes 115a are arranged as individual segments that form an annular ring that surrounds the plurality of first electrodes 104a.

The bias module 198b includes a plurality of first PV modules 196, one or more second PV modules 197, and a plurality of clamping networks 116. Each of the plurality of PV modules 196, 197 and the plurality of clamping networks 116 are independently controllable, e.g., by use of the system controller 126, to deliver one or more differently configured PV waveforms and/or chucking voltages to the plurality of substrate electrodes 104a or edge electrodes 115a, respectively coupled thereto.

The plurality of first PV modules 196 are similarly configured as described above in FIG. 2B, and each generally includes a PV waveform generator 150 electrically coupled to one of the substrate electrodes 104a, or group thereof, via a first power delivery line 157, a first filter assembly 151 disposed between the PV waveform generator 150 and the respective substrate electrodes 104a, or group thereof, and a blocking capacitor $C_5$. Individual ones of the plurality of clamping networks 116 are electrically coupled to each of the plurality of substrate electrodes 104a so that the blocking capacitor $C_5$ is disposed between the output of the PV waveform generator 150 and the clamping network 116a to protect the PV waveform generators 150 from the chucking voltage delivered to the respective substrate electrodes 104a. Here, the bias compensation circuit elements 116c are disposed between the blocking capacitor $C_5$ and the DC power supply 155 to prevent a PV waveform delivered from the PV waveform generator 150 from inducing current through the DC power supply 155.

Each of the one or more edge electrodes 115a may be electrically coupled to respective ones of the one or more second PV modules 197 and plurality of clamping networks 116 in a similar configuration as that shown for the plurality of substrate electrodes 104a. In some embodiments, process monitoring and control of the sheath tuning scheme is facilitated by the signal detection module 388 illustrated in FIG. 3 and described below.

Figure 2E:
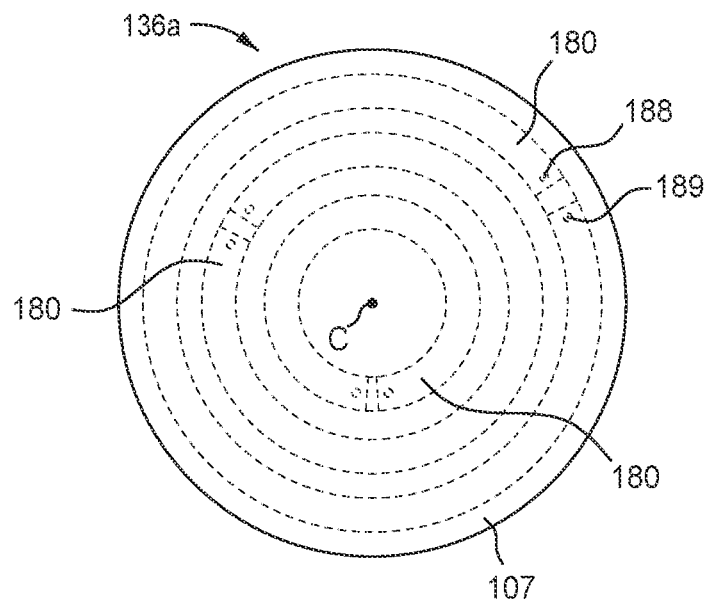
FIG. 2E is a sectional schematic plan view of the substrate support assembly illustrated in FIG. 1C.

FIG. 2E is a plan view of a support assembly 136a, according to one embodiment, that may be used with any of the processing chamber configurations described herein. FIG. 2E is a sectional view of a portion of support assembly 136a in FIG. 1C taken along section line 2E-2E, and includes a schematic view of the plurality of heating channels 180 that may be used to control the temperature of the support assembly 136a during processing. The heating channels 180 are arranged as a plurality concentric heating channels 180 disposed about center C, wherein the controller 126 enables one channel of the plurality of heating channels 180 be preferentially heated relative to each of the other channels of the plurality of heating channels 180. Each heating channel 180 having a heating fluid inlet 188 at one distal end of the channel and a heating fluid outlet 189 at the opposite end of the channel 180 to enable the circulation of the heated fluid. The heating channels 180 can include any number of annular channels to facilitate the temperature control of the support assembly 136a. Referring back to FIG. 2C, each of the annular heating channels 180, as shown in FIG. 2E, may be located directly below the annular rings of the plurality of first electrodes 104a that may be arranged as individual segments of a plurality of annular rings concentrically disposed about a center C of the substrate supporting surface 105a and the one or more second electrodes 115a arranged as individual segments that form an annular ring that surrounds the plurality of first electrodes. The heating channels 180 may be in a one-to-one relationship with the annular rings of electrodes 104a and 115a. In one embodiment, the annular heating channels 180 may be positioned below but between the annular rings of the plurality of electrodes 104a and 115a. In one embodiment, not shown, the cooling channels 190 are provided and arranged in the same number and pattern as the heating channels 180 and below the heating channels 180. Alternatively the heating channels 180 may be resistive heating elements.

During operation, the controller controls the power to the plurality of electrodes 104a and 115a and also controls the temperature of the heating channels 180 and the cooling channels 190 individually and together to control and maintain the temperature of the support assembly 136a during processing to provide a desired temperature profile across the surface of the substrate. In some embodiments, the temperature profile may include a radial variation in temperature, or alternately a uniform temperature profile.

Figure 2F:
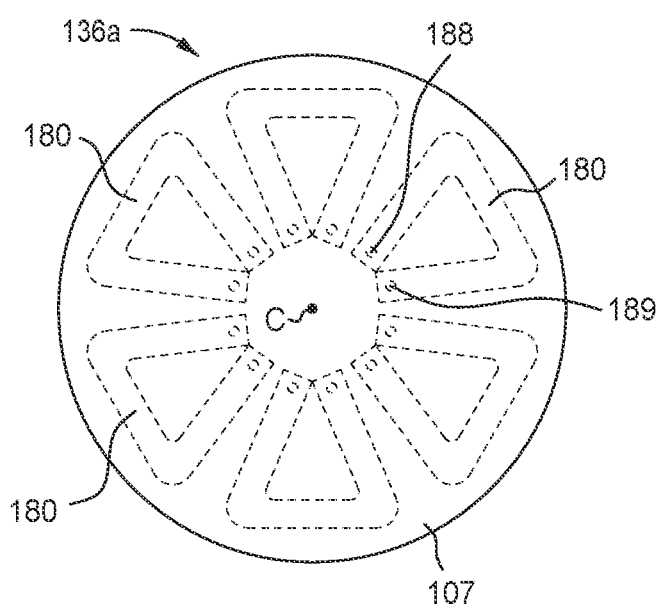
FIG. 2F is a sectional schematic plan view of another embodiment of the substrate support assembly illustrated in FIG. 1C.

FIG. 2F is a plan view of a support assembly 136a, according to alternative embodiment to the pattern of heating channels 180 shown in FIG. 2E, that may be used with any of the processing chambers configurations disclosed herein. FIG. 2F is a sectional view of a portion of support assembly 136a in FIG. 1C taken along line 2F-2F and a schematic view of the plurality of heating channels 180 and cooling channels 190 that may be used to control the temperature of the support assembly 136a before and during processing. Each heating channel 180 is shown as having triangular shape and with heating channel 180 having a heating fluid inlet 188 at one distal end of the channel and a heating fluid outlet 189 at the opposite end of the heating channel 180 to enable the circulation of the heated fluid or connection points for a resistive heating element configuration discussed herein. Although FIG. 2F shows six triangular shaped heating channels, any number of triangular shaped heating channels may be used to facilitate precise temperature control of the support assembly 136a. The triangular shaped pattern provides for sectional temperature control of the support assembly 136a across the triangular shaped regions about center C of the support assembly 136a. Alternatively, resistive heating elements may be used for heating the support assembly 136a using the same triangular shaped pattern. In one embodiment, not shown, the cooling channels 190 are provided and arranged in similar pattern that can include the same number and same arrangement as the heating channels 180, and be positioned below the heating channels 180.

Figure 2G:
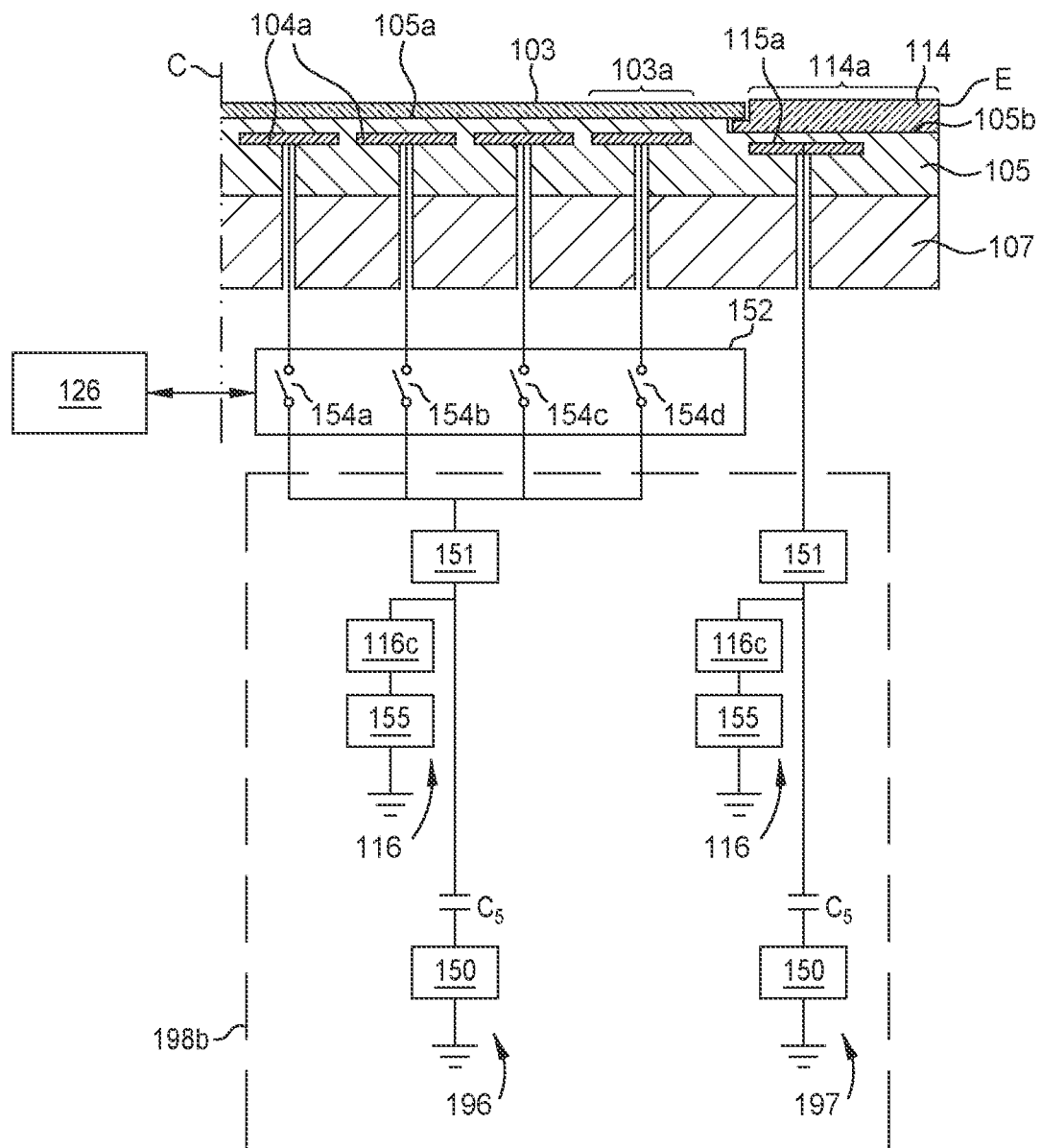
FIG. 2G is a sectional view of a portion of the support assembly of FIG. 2C and a simplified schematic diagram of a bias module and switching network, according to another embodiment.

FIG. 2G is a schematic cross-sectional view of a portion of the support assembly 136a of FIG. 2C taken along line B-B and includes a schematic diagram of a switching network 152 and bias module 198*b* that may be used as an alternative to the bias module found in FIGS. 2B and 2D to provide differently configurable PV waveforms and chucking voltages to respective electrodes of the plurality of electrodes 104*a* and 115*a*. The switching network 152 is coupled to the controller 126 and coupled between bias module 198*b* and the electrodes 104*a*. In one example, the switching network 152 includes switches 154*a*, 154*b*, 154*c*, and 154*d* with each switch connected between an electrodes 104*a* and the bias module 198*b*. Although four switches 154*a*, 154*b*, 154*c*, and 154*d* are shown in FIG. 2G, any number of switches may be utilized within switching network 152, on a one-to-one basis to couple the bias module 198*b* with each individual electrode 104*a* of the plurality of electrodes. However, in some embodiments, the switching network 152 includes a plurality of grouped electrode assemblies, wherein each grouped electrode assembly includes a bias module that is coupled to a single switch that is coupled to more than one electrode 104*a* and/or plurality of edge electrodes 115*a* to selectively deliver the PV waveforms or chucking voltages to a group of electrodes. In some embodiments, not shown, the switching network 152, may include additional switches connecting one or more PV modules 197 with one or more edge electrodes 115*a*. The bias module 198*b* includes at least one of one or more first PV modules 196, one or more second PV modules 197, and a clamping network 116. Each of the plurality of PV modules 196, 197, the plurality of clamping network 116*s* and each switch 154*a*, 154*b*, 154*c*, and 154*d* of switching network 152 are independently controllable, e.g., by use of the system controller 126, to deliver one or more differently configured PV waveforms and/or chucking voltages to the plurality of substrate electrodes 104*a* or edge electrodes 115*a*, respectively coupled thereto. The number and density of the substrate electrodes 104*a* and edge electrodes 115*a* contribute to the ability for controlling the PV waveforms and chucking voltages across the substrate 103 to adjust the plasma uniformity and chucking uniformity across the substrate. Thus, individual control of each substrate electrode 104*a* and edge electrode 115*a* relative to another substrate electrode 104*a* and/or edge electrode 115*a* enables control of the plasma density and chucking force at specific locations across the substrate 103 and support assembly 136*a*, which, in turn, enables precise process control while processing a substrate 103.

In some embodiments, not shown, the individual substrate electrodes 104*a* and the edge electrodes 115*a* are arranged in different pattern or groupings. For example, the electrodes may be arranged in a concentric pattern or sector pattern such that the patterns of electrodes align with and are positioned above the patterns of heating channels 180 shown in FIGS. 2E and 2F. Accordingly, via controller 126, electrodes 104*a* and 115*a*, the bias modules 198*a* or 198*b*, and with optional switching network 152, may be configured to control the plasma uniformity and chucking uniformity across the substrate together with control of the temperature of regions of the substrate support through the use of heating channels 180 and/or cooling channels 190 (shown in FIG. 1C), such as provide segmented temperature control by use of one of the heating channel 180 patterns shown in FIGS. 2E and 2F. The controller 126 can use sensors (e.g., temperature sensors, plasma density sensors (e.g., Langmuir probe), etc.) within the processing chamber or results from processed substrates to adjust the substrate support's segmented temperature control and bias applied to one or more of the electrodes 104*a* and 115*a* by the bias modules 198*a* or 198*b* to improve the process results found on substrates processed within the process chamber.

Process Monitoring and Control Examples

FIG. 3 is a simplified schematic section view of a processing chamber 100 and a schematic diagram illustrating the various components of a signal detection module 388 that may be used to monitor and control characteristics of a plasma sheath 101*a* during substrate processing. The processing chamber 100 includes the signal detection module 388, a support assembly 136, and a bias module 198. As shown, the processing chamber 100 is configured to generate a capacitively coupled plasma by delivering a radio frequency (RF) signal to the support base 107 from the RF power supply 118. However, it is contemplated that the signal detection module 388 can be used with any of the processing chambers 100*a*, 100*b*, 100*c*, support assembly 136*a*, and bias modules 198*a*, 198*b* described above to facilitate monitoring and control over the plasma sheath 101*a* during substrate processing.

Here, electrical signals that can be used to determine one or more characteristics of the plasma sheath 101*a* are received by the signal detection module 388, which then communicates information relating to the electrical signals to the system controller 126 for use in controlling aspects of the plasma process. Typically, the system controller 126 determines, based on the information received from the signal detection module 388, one or more characteristics of the plasma sheath 101*a* and compares the determined sheath characteristics to desired sheath characteristics. Based on the difference between the determined sheath characteristics to desired sheath characteristics, the system controller 126 may use the sheath tuning scheme described herein to adjust the one or more sheath characteristics, e.g., by changing a configuration of one or more of the PV waveforms established at the plurality of electrodes 104*a* and 115*a*. For example, the system controller 126 may cause the PV waveform generator 150 to change one or more characteristics of a pulsed voltage output delivered to respective electrodes 104*a* and 115*a* electrically coupled thereto.

FIG. 3 shows electrical connections between the signal detection module 388 and nodes N, and a group of electrodes 104*a* (here a substrate electrode 104*a*) to a first PV module 196 and a clamping network 116. To reduce visual clutter only one group of electrodes 104*a* is illustrated in FIG. 3, however it should be noted that in embodiments herein, the signal detection module 388 is configured to receive electrical signals through electrical connections to nodes N found on different portions of the circuit, such as various points along the connection between group of electrodes 104*a* and the first PV module 196.

As shown, the signal detection module 388 is electrically coupled to individual electrical components found within the processing chamber 100 by use of a plurality of signal lines 387. The plurality of signal lines 387 include multiple signal traces 392 that are coupled to various electrical components within the processing chamber 100 and are configured to deliver electrical signals to signal detection elements found within the signal detection module 388. In general, the signal detection module 388 includes one or more input channels 372 and a fast data acquisition module 320. The one or more input channels 372 are each configured to receive electrical signals from a signal trace 392 and are electrically coupled to the fast data acquisition module 320. The received electrical signals can include one or more characteristics of waveforms established using the plurality of PV waveform generators 150 (one shown) and/or the RF power supply 118.

The fast data acquisition module 320 includes one or more acquisition channels 322 that receive signal information from the individual components of the processing chamber 100a via the signal lines 387 and the one or more input lines 172. The fast data acquisition module 320 processes the received signal information to determine one or more characteristics of the PV waveforms generated by the bias module and communicates the processed signal information to the system controller 126.

Generally, the signal detection module 388 includes multiple input channels 372 that are each electrically coupled to a corresponding acquisition channel 322 of the fast data acquisition module 320. The multiple input channels 372 are coupled to connection points that are positioned in various parts of the plurality of first PV modules 196, the one or more second PV modules 197, and the clamping network 116 to measure and collect electrical data from these connection points or nodes N during processing. In some embodiments, the multiple input channels 372 are coupled to connection points that are positioned in various parts of the plasma generator assembly 163 to measure and collect electrical data from one or more points or nodes N within the plasma generator assembly 163 during processing. In some embodiments, the multiple input channels 372 may also be coupled to various electrical sensing elements, such as one or more current sensors, which are configured to measure and collect electrical data at various points within the processing chamber 100. In some embodiments, one or more of the input channels 372 includes a conditioning circuit 371 that may be used to generate conditioned waveforms, e.g., divided and filtered waveforms. The conditioning circuit may include a voltage divider, one or more low pass filters, both a voltage divider and one or more low pass filters, or even in some cases, neither a voltage divider nor a low pass filter, i.e., an unattenuated conditioning circuit.

The fast data acquisition module 320 is generally configured to receive analog voltage waveforms (e.g., conditioned waveforms) and transmit digitized voltage waveforms. The fast data acquisition module 320 is configured to generate a digitized voltage waveform from a received conditioned voltage waveform (e.g., output waveform), and a data acquisition controller 323 of the fast data acquisition module 320 is configured to determine one or more waveform characteristics of the conditioned voltage waveform by analyzing the first digitized voltage waveform.

Here, the fast data acquisition module 320 includes a plurality of acquisition channels 322, the data acquisition controller 323, and memory 324 (e.g., non-volatile memory). The data acquisition controller 323 is electrically coupled to an output of each of the acquisition channels 322 and is configured to receive the digitized voltage waveform from each of the acquisition channels 322. Further, algorithms stored within the memory 324 of the data acquisition controller 323 are adapted to determine one or more waveform characteristics of each of the conditioned waveforms by analyzing each of the digitized voltage waveforms. The analysis may include a comparison of information received in the digitized voltage waveform with information relating to one or more stored waveform characteristics that are stored in memory 324, as discussed further below.

The data acquisition controller 323 can include one or more of an analog-to-digital converter (ADC) (not shown), a processor 321 (FIG. 3), a communication interface (not shown), a clock (not shown), and an optional driver (not shown). The processor may be any general computing processor. Further, the processor may be a Field Programmable Gate Array (FPGA). The ADC converts the signal within the output waveforms from the analog domain to the digital domain, and the output digital signal of the ADC is provided to the processor 321 for processing. The processor 321 determines the one or more waveform characteristics of the output waveform by analyzing the output digital signal provided from the ADC.

The memory 324 may be any non-volatile memory. The data acquisition controller 323 may be electrically coupled with the memory 324 and is configured to cause waveform characteristics to be stored within the memory 324. In various embodiments, the memory 324 includes instructions executable by the data acquisition controller 323 to cause the data acquisition controller 323 to analyze the received output waveforms and/or transmit information corresponding to determined waveform characteristics based on the analysis of the received output waveforms. A waveform analyzer stored in memory 324 includes instructions executable by the data acquisition controller 323 and when executed, causes the data acquisition controller 323 to analyze the output waveforms to determine the waveform characteristics.

Information relating to the analyzed waveform characteristics can then be transmitted to one or more of a feedback processor 325 and/or the system controller 126. The analysis performed by the data acquisition controller 323 can include a comparison of the waveform characteristics and one or more waveform characteristic threshold values stored in memory 324. In some embodiments, the analysis is based on one or more electrical characteristics of the processing chamber 100a that are known and stored in memory. For example, an analysis performed by the data acquisition controller 323 may rely on one or more known electrical characteristics of the components of a processing chamber, such as substrate support dielectric layer capacitances ($C_1$, $C_2$), an insulator plate capacitance $C_3$, a support base resistance $R_P$, a ground plate resistance $R_G$, and a capacitance of the blocking capacitor $C_5$, each described above in relation to FIGS. 1D-1F.

In some embodiments, the system controller 126 analyzes the processed signal information to determine one or more characteristics of the plasma sheath 101a and compares the determined sheath characteristics to desired sheath characteristics. Based on the difference between the determined sheath characteristics and the desired sheath characteristics, the system controller 126 can make desired real-time adjustments to one or more of the pulsed voltage output signals 182 generated by the plurality of first PV modules 196 or the one or more second PV modules 197. Such adjustments may be used to change one or more characteristics of the respective PV waveforms established at one or more of the plurality of electrodes 104a and 115a to differentially bias one or more substrate surface regions 103a or edge ring surface regions 114a disposed thereover. Examples of PV waveforms that may be established at one of the plurality of electrodes 104a and 115a and at a substrate surface region 103a or an edge ring surface region 114a are illustrated in FIGS. 4A-4B.

Pulsed Voltage Waveform Examples

Figure 4A:
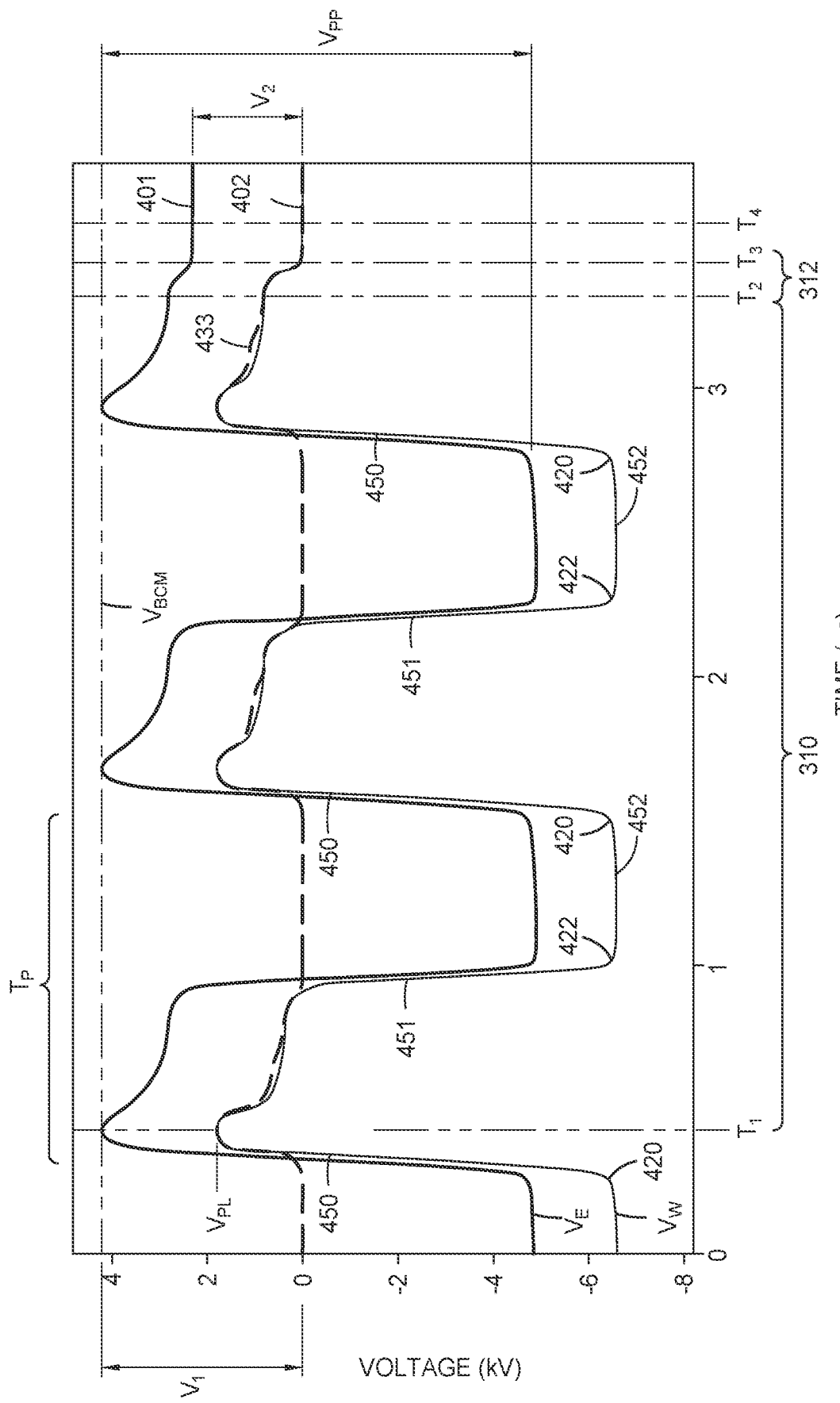
FIGS. 4A-4B schematically illustrate example pulsed voltage (PV) waveforms, according to some embodiments, that may be used to practice the methods set forth herein.
Figure 4B:
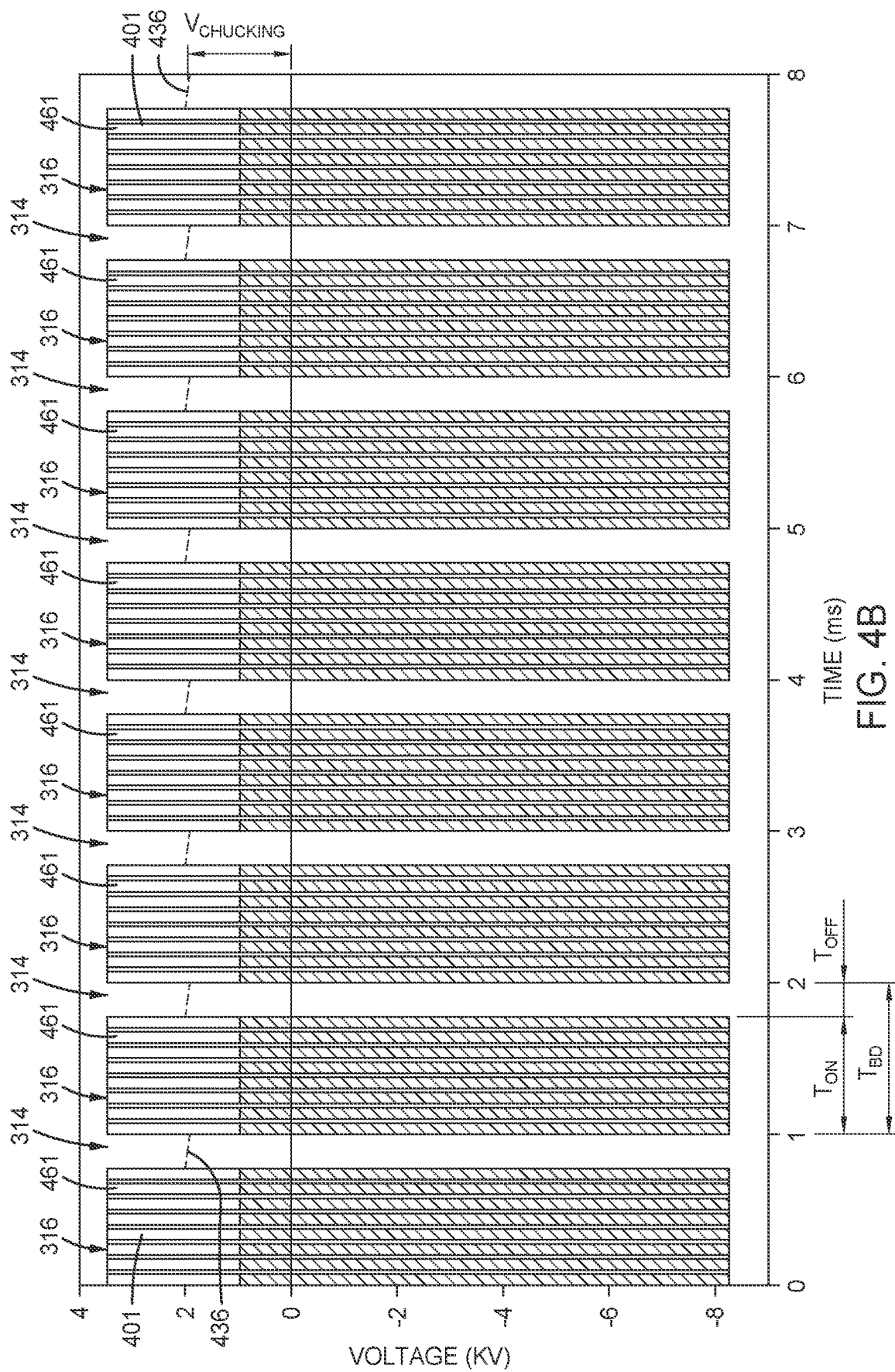

FIG. 4A is a schematic illustration of pulsed voltage (PV) waveforms established at an electrode 104a and at a substrate surface region 103a disposed over the electrode 104a. FIG. 4B illustrates a series of burst-on and burst-off periods for a pulsed voltage waveform established at an electrode 104a. The PV waveforms depicted in FIG. 4A include a first PV waveform 401 established at one of the plurality of electrodes 104a, e.g., here a substrate electrode 104 illustrated in FIGS. 6A-6C, and a second PV waveform 402 established at a corresponding substrate surface region 103a disposed over the substrate electrode 104. The first PV waveform 401 and the second PV waveform 402 are exemplary of PV waveforms that may be established at any one of the electrodes 104a and 115a using a PV module 196, 197 and the corresponding PV waveforms established at surface regions of the substrate 103 or edge ring 114 disposed thereover. However, it is contemplated that one or more characteristics of different first PV waveforms 401 established at the plurality of electrodes 104a and 115a may be differently configured to cause differential biasing of corresponding substrate surface regions 103 or surface regions of the edge ring 114, such as described in the methods below.

As discussed above, the first PV waveform 401 is established at the first electrode 104 using pulsed voltage signal (not shown) output of a PV waveform generator 150 and the DC power supply 155 of the first clamping network 116a. The second PV waveform 402 is established by the first PV waveform 401 at a surface region of a substrate 103 or edge ring 114 disposed over the electrode 104a or 115a, here a substrate surface region 103a or an edge ring surface region 114a. Generally, the output of the PV waveform generator 150, which can be controlled by a setting in a plasma processing recipe stored in the memory of the system controller 126, forms the first PV waveform 401, which includes a peak-to-peak voltage referred to herein as the voltage pulse level $V_{pp}$ or voltage pulse amplitude.

As discussed below, during plasma processing, positively charged ions are accelerated across the electron-repelling plasma sheath 101a to bombard the substrate surface. Typically, a difference between an electron current and the ion current ($I_i$) across the plasma sheath 101a causes the accumulation of a positive charge on the substrate surface so that the substrate potential increases over time. If allowed to continue, the accumulating charge would lead to a voltage drop across the first dielectric material layer 105c (i.e., the capacitance $C_1$) instead of across the plasma sheath 101a (i.e., a sheath capacitance) as desired. Thus, in some embodiments, the first PV waveform 401 is configured to periodically cause a collapse in the plasma sheath 101a so that the capacitance of the sheath is discharged and the substrate potential is brought to the level of the local plasma potential 433 and electrons are allowed to flow from the plasma 101 to the substrate surface to neutralize the accumulated positive charge.

Here, the second PV waveform 402, which has a waveform period $T_P$, is the waveform seen by the substrate surface region 103a due to the delivery of the first PV waveform 401 to the electrode 104a and is characterized as including a sheath collapse and recharging phase 450 (or for simplicity of discussion, the sheath collapse phase 450) that extends between point 420 and point 421, a sheath formation phase 451 that extends between point 421 and point 422, and an ion current phase 452 that extends between point 422 and back to the start at point 420 of the next sequentially established pulse voltage waveform.

The sheath collapse phase 450 generally includes a time period where the capacitance of the sheath is discharged, and the substrate potential is brought to the level of the local plasma potential. A plasma potential curve 433 illustrates the local plasma potential during the delivery of the first PV waveform 401 that is established at an electrode 104a or 115a by use of a PV waveform generator 150. During the ion current phase 452, ion current ($I_i$) across the electron depleted plasma sheath 101a deposits a positive charge on the substrate surface that causes the substrate potential to increase over time, as seen by the upward slope between points 422 and 420. The increase in the substrate potential causes a corresponding decrease in the sheath voltage that accelerates ions across the plasma sheath 101a, which results in progressively lower ion energies at the substrate surface. Typically, the longer the duration of the ion current phase 452 the wider the distribution of ion energies and the shorter the duration the narrower the distribution. Thus, in some embodiments, controlling one or more sheath characteristics includes adjusting one or both of the PV waveform frequency ($1/T_P$) or the ion current phase duty cycle, as described below, to control the ion energy distribution at the substrate surface. In some embodiments, the sheath tuning scheme includes differently biasing the substrate 103 using PV waveforms having different frequencies and/or ion current phase duty cycles to cause different ion energy distributions at different portions of the substrate 103, e.g., to provide for local, lateral, and/or radial control over ion energy distributions at the substrate surface.

In embodiments herein, differentially biasing one or more substrate surface regions 103a and/or one or more edge ring surface regions 114a includes establishing one or more differently configured first PV waveforms 401 at respective ones of the plurality of electrodes 104a and 115a. Establishing the one or more differently configured first PV waveforms 401 includes adjusting one or more parameters at a PV module 196, 197 electrically coupled to at least one of the electrodes 104a and/or 115a. As described in the method below, PV waveform characteristics that may be adjusted to differently bias a substrate surface region 103a and/or an edge ring surface region 114a include PV waveform frequency ($1/T_P$), voltage pulse amplitude $V_{PP}$, pulse duty cycle, chucking voltage, and/or other parameters that cause a change in a potential of the corresponding substrate surface region 103a with respect to the plasma 101 formed thereover. Here, an ion current phase duty cycle is defined as the ratio of the ion current time period (e.g., time between point 422 and the subsequent point 420 in FIG. 4) and the waveform period $T_P$. In some embodiments, the ion current phase duty cycle is greater than 50%, or greater than 70%, or between about 80% and about 95% to provide a nearly constant sheath voltage across a substantial portion of the PV waveform cycle. The differently configured ones of the plurality of first PV waveforms 401 established at corresponding electrodes of the plurality of first electrodes 104a and/or one or more second electrodes 115a can be used collectively to provide desirable characteristics in the plasma sheath 101a across the surface of the substrate 103.

In some embodiments, it is desirable to determine the characteristics of the plasma sheath 101a during processing by use of the signal detection module 388 described in FIG. 3. To facilitate determining sheath characteristics during processing, the first PV module 196a is configured to establish first PV waveform 401 that includes repeating cycles of a burst 316 of repeating pulses 461 (FIG. 4B) having a burst-on period 310 followed by a burst-off period 314 where the output of the PV waveform generator 150 is stopped so that no PV waveforms are being generated by the PV waveform generator 150. As shown in FIGS. 4A and 4B, the burst-on period 310 extends from $T_1$ to $T_2$ and the burst-off period 314 (FIG. 4B) extends from $T_2$ to the beginning of the next burst-on period 310, i.e., at the start point 420 of the next burst 316 of repeating pulses. A burst cycle, which includes a burst 316 of pulsed voltage waveforms and a serially performed burst-off period 314, can be repeated multiple times during the processing of a substrate.

In one example, the burst-on period 310 is between about 100 microseconds (μs) and about 10 milliseconds (ms), such as between about 200 us and about 5 ms. In one example, the waveform period $T_P$ is between about 1 us and about 10 µs, such as about 2.5 µs. The burst duty cycle can be between about 5%-100%, such as between about 50% and about 95%, wherein the duty cycle is the ratio of the burst-on period 310 divided by the burst-on period 310 plus the burst-off period 314. During processing, the plasma potential generally remains at or close to zero volts throughout most of a burst-on period 310 and during a burst-off period 314 (FIG. 4B). Between the burst 316 and a steady-state portion of the burst-off period 314, e.g., from time $T_2$ to $T_3$, is a transition region, which is referred to herein as a plasma relaxation period 312. The time $T_4$ is intended to represent a measurement time that is positioned after the plasma relaxation period 312 has ended and before the next burst 316 (FIG. 4B) has started.

In some embodiments, the signal detection module 388 and data acquisition controller 323 are used to receive digitized voltage waveforms and other electrical information and determine waveform characteristics or other system characteristics based on information acquired at different times or periods of time during the burst-on period 310 and burst-off period 314. For example, in FIG. 4A, the signal detection module 388 and data acquisition controller 323 may be used to receive digitized voltage waveforms and/or determine waveforms for the waveform $V_E$ formed at said electrode 104a and the waveform Vw formed at the substrate surface region 103a disposed over said portion of the substrate supporting surface 105a. The data acquisition controller 323 can also be used to determine waveform characteristics at different times in the burst-on period 310, the burst-off periods 314, such as the voltage $V_1$ of the electrodes 104a at time $T_1$ during the burst-on period 310 and the voltage at $V_2$ for the capacitance between an output voltage ($V_{BCM}$) from the first clamping network 116a to the electrodes 104a at time $T_3$.

In the example illustrated in FIG. 4B, a plurality of pulses 461 within each burst 316 forms a pulse series of first PV waveforms 401 that are established at the electrodes 104a and 115a. In this example, each of the bursts 316 includes pulses 461 that have a PV waveform that has a consistent pulsed voltage shape (e.g., constant voltage magnitude is provided during a portion of each first PV waveform 401), a burst delivery length $T_{ON}$ that does not vary from one burst 316 to another over time and a burst rest length $T_{OFF}$ that does not have a varying length over time. The burst rest length $T_{OFF}$ is formed by halting the delivery of the PV waveforms provided during the burst delivery length $T_{ON}$ time for a period of time. As illustrated in FIG. 4B, during the burst rest length $T_{OFF}$ a biasing electrode potential curve 436 for each of the plurality of electrodes 104a and 115a is primarily controlled by a chucking voltage that is applied and controlled by a respective clamping network 116, 116a, 116b.

Beneficially, the pulsed voltage waveforms 401 established at each electrodes 104a and 115a can be used to adjust a potential of a corresponding substrate surface region 103a or substrate adjacent surface region, e.g., an edge ring surface region 114a to provide for local tuning of the portion of the plasma sheath 101a formed thereover. Used collectively, differently configurable pulsed voltage waveforms established at each of the plurality of the electrodes 104a and 115a facilitate azimuthal control (with reference to the center of the substrate surface) and lateral control (across a width) of the plasma sheath 101a, as described in the methods below.

Plasma Processing Method Examples

The processing chambers and pulsed voltage waveforms described above can be used advantageously to provide improved control over characteristics of a plasma sheath formed during the plasma-assisted processing of the semiconductor substrate. For example, the methods described below can be used to provide a desired thickness profile of a plasma sheath, e.g., to shape a boundary between the plasma sheath and the plasma, in order to control the directionality of ions accelerated towards the surface of the substrate. The methods generally include establishing one or more differently configured pulsed voltage waveforms at corresponding electrodes 104a and 115a disposed in a substrate support 105. In some embodiments, the differently configured pulsed voltage waveforms are used to differently bias one or a grouping of discrete substrate surface regions 103a or one or a grouping of edge ring surface regions 114a to adjust one or more characteristics of the portions of the plasma sheath formed thereover, such as sheath voltage and sheath thickness.

Figure 5:
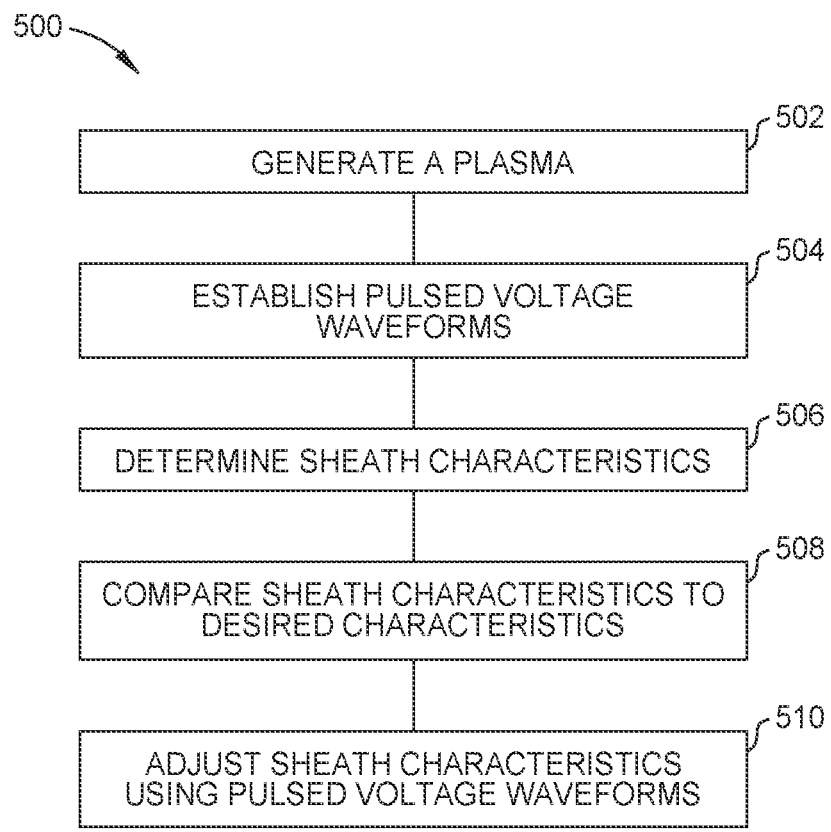
FIG. 5 is a diagram of a plasma-assisted processing method, according to one embodiment, that can be performed using any one of the processing chambers in FIGS. 1A-1C.

FIG. 5 is a diagram of a method 500 for controlling one or more characteristics of a plasma sheath using embodiments of the sheath tuning scheme described above. Generally, the method uses one or more differently configured pulsed voltage (PV) waveforms established at a plurality of one or more electrodes, disposed in an arrangement where each of the electrodes can be used to differentially bias a surface region of a substrate positioned on the support. In some embodiments, the method is used to adjust and/or control the directionality as well as the energy and angular distributions of ions that bombard a substrate surface during a plasma-assisted etch process, such as the reactive ion etch (RIE) process illustrated in FIGS. 6A-6C.

Figure 6A:
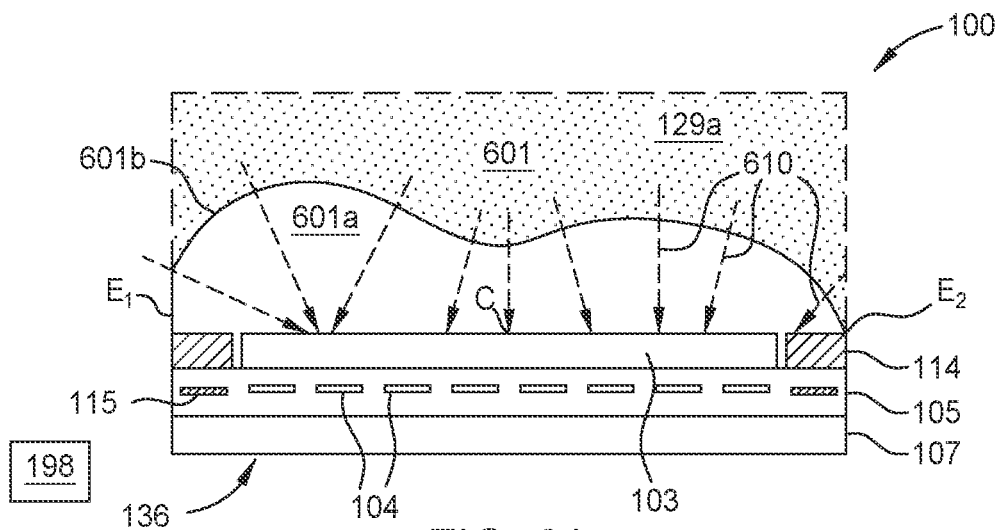
FIGS. 6A-6C are schematic side views of a plasma-assisted etch process, according to some embodiments, that illustrate aspects of the method set forth in FIG. 5.
Figure 6B:
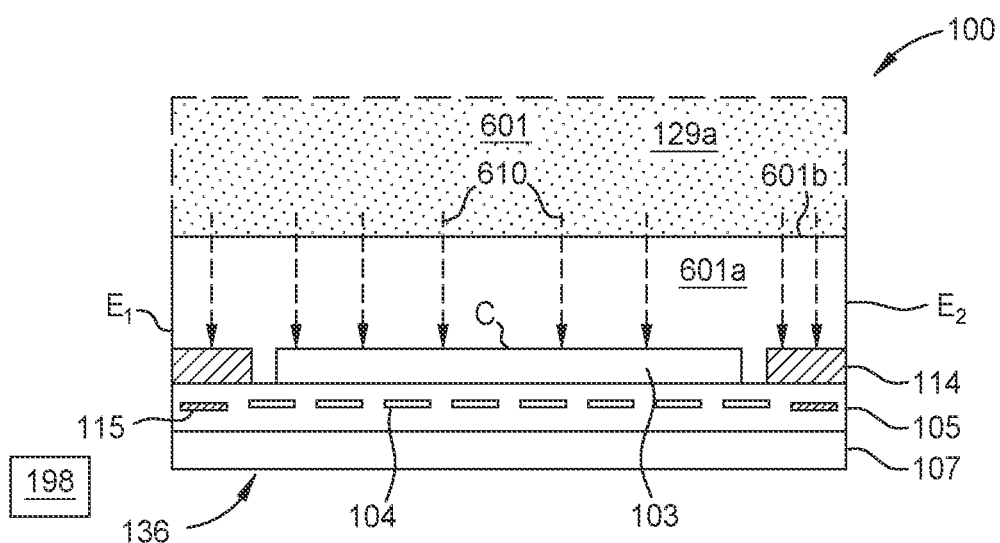
Figure 6C:
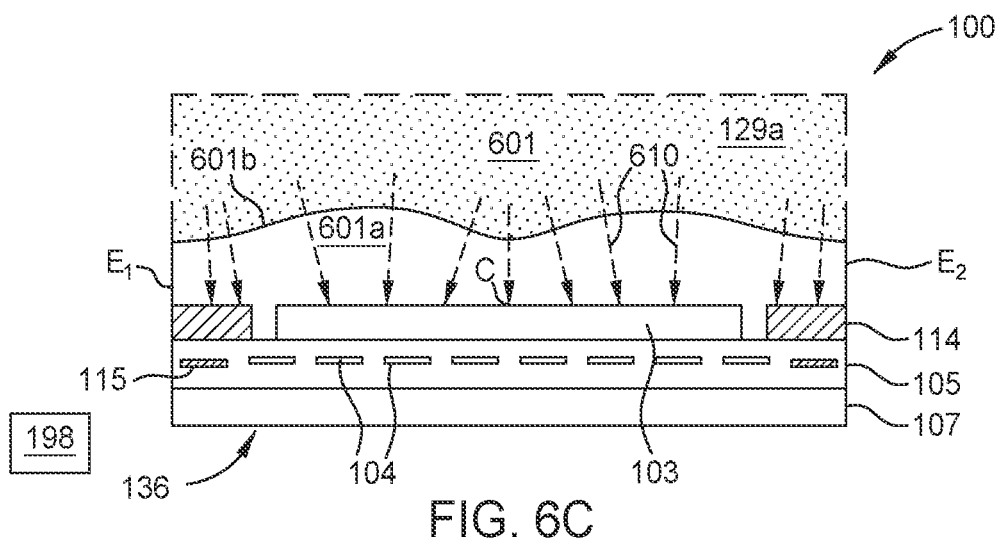

FIGS. 6A-6C are schematic side views of a portion of a processing chamber 100 that illustrate applications of the method 500 in a reactive ion etch (RIE) process. As shown, the RIE process is performed using a bias module 198 that is electrically coupled to a support assembly 136 disposed in the processing region 129a of a processing chamber 100 (partially shown). It is contemplated that the processing chamber 100, the bias module 198, and the support assembly 136 may have any combination of the elements described in relation to FIGS. 1A-1E, 2A-2D, 3, and 4A-4B and that references numerals to elements described but not shown in FIGS. 6A-6C should be understood to designate elements illustrated in those figures. In some embodiments, the method 500 is used to adjust for undesirable non-uniform sheath thickness profiles, such as shown in FIG. 6A, which allows for local, lateral, and azimuthal tuning of the shape of a sheath boundary 601b between the plasma sheath 601a and the plasma 601.

Generally, the sheath thickness profile is sensitive to a wide variety of processing conditions, such as chamber and component geometries, material properties of surfaces in the processing chamber, the distribution of power(s) used to generate the plasma, electrical discontinuities between the substrate and substrate adjacent surfaces, and adjustable processing parameters such as chamber pressure, flow rates and the distribution of processing gases into the processing chamber, as well as substrate biasing conditions.

Processing conditions that influence the sheath thickness profile can also change over the useful lifetime of chamber components, e.g., by erosion of component surfaces to change the geometries, and material surface properties thereof, across a production cycle, e.g., by the accumulation of processing byproducts on component surfaces between chamber cleaning operations, and/or due to differences in product or manufacturing operation dependent processing parameters. Thus, the plasma sheath 601a will often undesirably have at least some thickness variation so that the resulting sheath boundary 601b is not parallel to the surface of the substrate 103. Due to the variety of influences on the sheath thickness profile, the shape of the sheath boundary 601b may also have local, lateral, and/or radial asymmetries that can cause corresponding non-uniform processing result profiles across the surface of the substrate 103.

For example, in FIG. 6A the sheath thickness profile is both laterally asymmetric and radially asymmetric so that the directionality 610 of ions accelerated across the plasma sheath 601a have a distribution of oblique incidence angles that vary both laterally (e.g., form $E_1$ to $E_2$) and radially (e.g., from C to $E_1$ or $E_2$) across the surface of the substrate 103. The distribution of incidence angles is likely to cause undesirable processing results, such as undesirable tilt in openings formed in the substrate surface during an etching process. Thus, in some embodiments, the method 500 provides for differential biasing of one or more discrete regions or zones across the surface of the substrate to correct local, lateral, and radial non-uniformities in the plasma sheath 601a. In some embodiments, the method 500 includes adjusting the differential bias applied to various electrodes 104 and 115 to adjust the shape of a sheath boundary 601b so that the sheath boundary 601b is substantially parallel to the surface of the substrate 103, such as shown in FIG. 6B. The adjusted sheath boundary 601b will thus result in vertical or nearly vertical ion incidence angles across the surface of the substrate 103. In some embodiments, the method 500 is used to tailor the shape of the sheath boundary 601b, such as shown in FIG. 6C. The sheath boundary 601b may be shaped to provide for differences in ion incidence at desired surface regions on the substrate 103 and/or to increase or decrease the ion flux at such regions.

At activity 502, the method 500 includes generating a plasma 601 in the processing region 129a. Generally, generating the plasma 601 includes igniting and maintaining the plasma 601 from gases or vapors delivered to the processing region 129a. In some embodiments, igniting and maintaining the plasma 601 includes delivering a radio frequency (RF) signal to one or both of the chamber lid 123a and the support base 107. In some embodiments, igniting and maintaining the plasma 101 includes delivering an RF signal to one or more inductive coils 117, such as shown in FIG. 1C, disposed over the chamber lid 123a. In some embodiments, an RF frequency of the RF signal used to ignite and maintain the plasma is about 400 KHz or more, such as about 1 MHz or more, or about 2 MHz or more, about 13.56 MHz or more, about 27 MHz or more, about 40 MHz or more, or, for example, between about 30 MHz and about 200 MHZ, such as between about 30 MHz and about 160 MHz, between about 30 MHz and about 120 MHz, or between about 30 MHz and about 60 MHz.

At activity 504, the method 500 includes establishing a respective pulsed voltage waveform at each of a plurality of electrodes 104a and 115a disposed in the substrate support 105, where each of the electrodes 104a and 115a is electrically coupled to an individually controllable PV waveform generator 150. Typically, the electrodes include one or more bias electrodes of a plurality of bias electrodes disposed in the dielectric body, e.g., one or more of the plurality of first and second electrodes 104, 115. The plurality of bias electrodes can be disposed in any arrangement described above, such as an array or as concentric rings, and are generally spaced apart from one another (when viewed from top-down) so that individual ones or groups of the bias electrodes can be used differently bias discrete substrate surface regions 103a and/or discrete regions of substrate-adjacent surfaces, such as surface regions of the edge ring 114 disposed thereover.

In some embodiments, the plurality of bias electrodes can be arranged in repeating patterns across a width, diameter, or a radius of the substrate support 105, such as an array pattern, sector pattern, concentric ring pattern, quadrant pattern, or combinations thereof. Thus, the one or more bias electrodes of each of the plurality of electrodes 104 are arranged to facilitate local, radial, lateral, and/or azimuthal adjustments to characteristics of a plasma sheath 601a formed between the substrate support 105 and the plasma 601. Local adjustments to the plasma sheath 601a may be made by changing one or more characteristics of a pulsed voltage waveform established at an individual biasing electrode relative to characteristics of pulsed voltage waveforms established at one or more adjacent biasing electrode (when viewed from top-down). In some embodiments, the plurality of electrodes 104a are arranged to provide for radially asymmetric local tuning so that biasing electrodes 104a arranged along a radius of the substrate support 105 can be used to differently bias a discrete substrate surface region 103a relative to other surface regions at the same radius.

As shown, the plurality of electrodes 104 include a plurality of substrate electrodes 104 disposed a distance from the substrate supporting surface 105a and a plurality of edge electrodes 115 disposed a distance from the edge ring support surface 105b. In some embodiments, activity 504 further includes establishing differently configured pulsed voltage waveforms between at least two of the plurality of edge electrodes 115, between at least one of the plurality of substrate electrodes 104 and at least one of the plurality of edge electrode 115, or both.

Generally, each PV waveform generator 150 is independently controllable so that a differently configured pulsed voltage waveform can be established at each individual one of the plurality of electrodes 104a and/or 115a if so desired. Examples of pulsed voltage waveforms are described above in relation to FIG. 4 and typically include a series of repeating pulse cycles, where a waveform period within each repeating pulse cycle includes a first portion having a first time interval and a second portion having a second time interval, a voltage pulse 461 is only present during the first time interval, the waveform is substantially constant during the second time interval, and the second time interval is longer than the first time interval to provide a voltage pulse duty cycle of less than 50%. In some embodiments, the voltage pulse duty cycle is about 45% or less, such as about 40% or less, about 35% or less, about 30% or less, about 25% or less, such as about 20% or less, or between about 1% and about 30%, such as between about 5% or 30%, or between about 5% and about 25%. In some embodiments, the waveform period $T_P$ is between about 10 μs and about 1 μs, such as between about 5 μs and about 1 μs, for example about 2.5 μs, so that the waveform frequency ($1/T_P$) is between about 100 KHz and about 1 MHZ, or between about 200 kHz and about 1 MHZ, or about 400 kHz. In some embodiments, the waveform frequency is about 1 MHz or less, or about 500 KHz or less and/or about 100 kHz or more, or about 200 KHz or more.

At activity 504, one or more characteristics of the pulsed voltage waveforms established at at least one of the plurality of substrate electrodes 104 are different from the characteristics of one or more of the pulsed voltage waveforms established at other ones of the plurality of substrate electrodes 104. The different waveform characteristics established between the at least two of the plurality of substrate electrodes 104 may be used to differently bias desired substrate surface regions 103a disposed thereover. In some embodiments, activity 504 includes establishing pulsed voltage waveforms with different characteristics between at least two of the edge electrodes 115. Examples of waveform characteristics that may be differently established by use of the plurality of PV waveform generators 150 include voltage pulse duty cycle, voltage pulse amplitude, waveform frequency, and clamping voltage.

In some embodiments, the one or more different characteristics include a difference in voltage pulse amplitude of about 5 volts or more, such as about 10 volts or more, about 20 volts or more, about 40 volts or more, about 60 volts or more, about 80 volts or more, or about 100 volts or more. In some embodiments, the difference in voltage pulse levels established at at least two different substrate electrodes 104 is about 500 volts or less, such as about 250 volts or less, about 200 volts or less, about 180 volts or less, about 160 volts or less, about 140 volts or less, about 120 volts or less, about 100 volts or less, about 80 volts or less, about 60 volts or less, for example about 40 volts or less. In some embodiments, the difference in voltage pulse levels established at at least two substrate electrodes 104 is between about 500 mV and about 500 volts, such as between about 1 volts and about 250 volts, or between about 5 volts and about 500 volts.

In some embodiments, the one or more different characteristics include a difference in pulse duty cycles of between about 1% and about 50%, such as about a 1% difference or more, about a 5% difference or more, a about 10% difference or more, about a 15% difference or more, about a 20% difference or more, about a 25% difference or more, about a 30% difference or more, about a 35% difference or more, about a 40% difference or more, about a 45% difference or more, about a 50% difference or more, about a 55% difference or more, about a 60% difference or more, about a 65% difference or more, about a 70% difference or more, about a 75% difference or more, or about an 80% difference or more. In some embodiments, a difference between a voltage pulse duty cycle established at one of the plurality of electrodes 104 and the voltage pulse duty cycle established at one or more of the other electrodes 104 is about 80% or less, such as about 75% or less, about 70% or less, about 65% or less, about 60% or less, about 55% or less, about 50% or less, about 45% or less, about 40% or less, about 35% or less, about 30% or less, about 25% or less, about 20% or less, about 15% or less, such as about 10% or less. In some embodiments, a difference in voltage pulse duty cycles between substrate electrodes 104 is between about 5% and about 80%, such as between about 5% and about 60%, between about 5% and about 50%, between about 5% and about 40%, between about 5% and about 30%, or between about 5% and 25%.

In some embodiments, the one or more different characteristics include a difference in PV waveform pulse repetition frequency ($1/T_P$) of about 5% or more, such as about 10% or more, about 15% or more, about 20% or more, about 25% or more, about 30% or more, about 35% or more, about 40% or more, about 45% or more, or about 50% or more. In some embodiments, the waveform frequency is substantially the same between individual ones of the plurality of substrate electrodes 104 and/or between individual ones of the plurality of edge electrodes 115a.

In some embodiments, one or more timing and triggering circuits 153 are used to synchronize the waveform frequency between individual ones of the plurality of substrate electrodes 104a and/or individual ones of the plurality of edge electrodes 115a. For example, in some embodiments, one of the one or more timing and triggering circuits 153 are used to synchronize the beginnings of the voltage pulses between two or more of the established pulsed voltage waveforms that are applied between substrate electrodes 104, or between the plurality of edge electrode 115, or between substrate electrode 104 and edge electrode 115. In some embodiments, the timing and triggering circuit 153 is used to provide a desired offset to the beginnings of the voltage pulses of one or more of the pulsed voltage waveforms relative to other ones of the pulsed voltage waveforms, such as to trigger asynchronous sheath collapse phases 450 and/or sheath formation phases 451 across different substrate surface regions 103a or edge ring surface regions 114a.

In some embodiments, the one or more different waveform characteristics include a difference in a clamping voltage delivered to at least one of the plurality of electrodes 104a and 115a from a direct current (DC) voltage source, e.g., a DC power supply 155, electrically coupled thereto. As described above, in some embodiments, each of the plurality of electrodes 104a and 115a is electrically coupled to one of one or more DC voltage sources. The DC voltage source delivers a clamping voltage to the plurality electrodes 104a and 115a that is used to "clamp" or "chuck" a substrate 103 or edge ring 114 to the substrate support 105, e.g., by generating an electrostatic attraction between the substrate 103 and the substrate electrodes 104a disposed there below. In some embodiments, a voltage divider 155a is used to adjust clamping voltages delivered from one DC voltage source to two or more of the plurality of substrate electrodes 104a and/or two or more of the plurality of edge electrodes 115a. In some embodiments, a difference in the clamping voltage delivered to between at least two of the plurality of substrate electrodes 104a and/or at least two of the plurality of edge electrodes 115a is about 5% or more, such as about 10% or more, about 15% or more, about 20% or more, about 25% or more, about 30% or more, about 35% or more, about 40% or more, about 45% or more, or about 50% or more.

In some embodiments, the method 500 further includes determining one or more characteristics of the plasma sheath 601a at activity 506, comparing the determined sheath characteristics to desired sheath characteristics at activity 508, and based on the comparison, adjusting one or more characteristics of the plasma sheath 601a at activity 510. Here, activity 506 of the method 500 includes using the signal detection module 388 to determine the one or more sheath characteristics based on electrical data obtained from one or more nodes N and electrical connection points and/or sensors disposed within the processing chamber 100. In some embodiments, the signal detection module 388 is used to determine one or more sheath characteristic profiles based on electrical data obtained from different nodes N and electrical connection points corresponding to at least some of the plurality of electrodes 104a and/or 115a. For example, the signal detection module 388 may be used to detect and monitor waveforms established at different nodes N and connections, including an individually controllable PV waveform generator 150 and a corresponding one of the plurality of electrodes 104a electrically coupled thereto, such as described above in FIG. 3. The electrical data collected from one or more nodes N and connection points can be used to determine and monitor one or more characteristics of the portion of the plasma sheath 601a formed over the electrodes 104a and 115a. Data collected from the plurality of the one or more nodes N and connection points can be used collectively to define one or more sheath characteristic profiles, such as a sheath thickness profile, across the substrate support 105, where a resolution of a sheath characteristic profile is determined by the number of the monitored biasing pixels.

In some embodiments, the respective pulsed voltage waveforms established at each of the plurality of electrodes 104a and 115a includes a series of repeating burst cycles of a burst-on period 310 followed by a burst-off period 314, where the burst-on period 310 includes a series of the repeating pulse cycles that have a period $T_P$ and an output of the PV waveform generator is stopped during the burst-off period 314. Electrical data collected from one or more of the nodes N and/or sensors disposed in the processing chamber 100 during the burst-off period can be used to determine electrical characteristics of portions of the plasma process, such as the plasma potential, that may fluctuate during the burst-on period. In those embodiments, the electrical data used to determine the one or more sheath characteristics includes electrical data collected from one or more nodes N and/or sensors, which are disposed within or coupled to electric elements of regions of the processing chamber, during a burst-on period 310 and electrical data collected from the same or different nodes and/or sensors during a burst-off period 314. In some embodiments, the one or more timing and triggering circuits 153 are used to synchronize the burst-on and burst-off periods 310, 314 between the plurality of electrodes 104a and 115a or to provide a desired offset between the beginnings of the burst-on or burst-off periods 310, 314.

In some embodiments, activity 508 of the method 500 includes comparing the determined sheath characteristics to desired sheath characteristics includes comparing the determined sheath characteristics to one or more desired sheath characteristics stored in memory 324. In some embodiments, the desired sheath characteristics are set in a processing recipe used by the system controller 126 to control the operation of the processing chamber 100 during substrate processing. Based on the comparison, activity 510 of the method includes changing one or more characteristics of a pulsed voltage waveform established at one or more of the plurality of electrodes 104a and 115a relative to characteristics of one or more pulsed voltage waveforms established at other ones of the plurality of electrodes 104a and 115a. In some embodiments, activity 510 includes changing one or more relative characteristics of pulsed voltage waveforms established at different electrodes 104a and 115a to cause the plasma sheath 601a to have a substantially uniform thickness profile radially, circumferentially and/or across the width or diameter of a substrate 103 disposed on the substrate support 105, such as shown in FIG. 6B, where the uniform profile extends over at least a portion of the edge ring 114 that surrounds the substrate 103, e.g., from $E_1$ to $E_2$. The substantially uniform sheath thickness profile shown in FIG. 6B provides a sheath boundary 601b that is substantially parallel to the surface of the substrate 103 so that ions accelerated theretowards have a normal or nearly normal incidence angle.

In some embodiments, the desire sheath characteristics of activity 508 include a non-uniform sheath thickness profile, such as the thickness profile of the plasma sheath 601a shown in FIG. 6C. The non-uniform sheath thickness profile causes bends in the sheath boundary 601b over portions of the surface of the substrate 103, and the directionality 610 of ions accelerated across the plasma sheath 601a to be oblique to the surface of the substrate 103. The ability to control the shape of the sheath boundary 601b can be used to cause a tilt in openings formed in the surface of the substrate 103 (if such a tilt is desired) and/or to focus or defocus the accelerated ions to or away from a desired region of the substrate surface, e.g., to increase or decrease an etch rate in that region relative to etch rates in other regions. In some embodiments, the sheath boundary 601b is shaped based on non-uniformities in processing results from a prior manufacturing operation, such as a non-uniform thickness of a material layer deposited on the substrate at an earlier manufacturing operation.

Figure 7A:
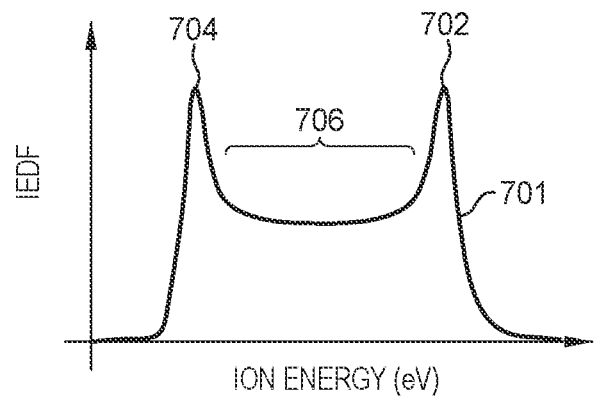
FIG. 7A is a graph schematically representing an ion energy distribution function (IEDF) of a radio-frequency (RF) biased process.
Figure 7B:
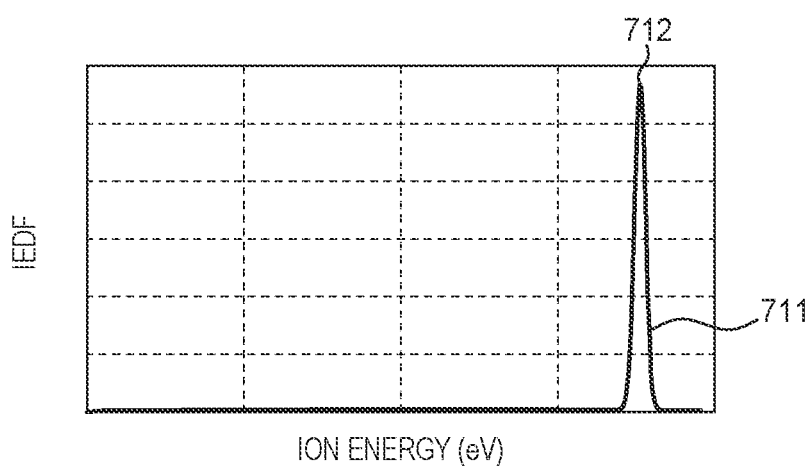
FIG. 7B is a graph schematically representing an ion energy distribution function (IEDF) that may be obtained using embodiments described herein.

Beneficially, the sheath tuning scheme can be used to generate a desired ion energy distribution function (IEDF) across various regions of the substrate surface, where the distribution of ion energies 711 is relatively narrow and provides a single-peak 712, such as illustrated in FIG. 7B, and a uniform sheath thickness profile at and across the substrate surface and substrate adjacent surfaces, such as illustrated in FIG. 6B. The narrow single-peak IEDF and the uniform sheath thickness profile can be used to collectivity provide a narrow distribution of high-energy ions with a normal or near-normal incidence at the substrate surface, which is desirable for forming nearly vertical closely spaced high-aspect ratio openings. In some embodiments, the sheath tuning scheme can be used to provide a different IEDF, different ion directionally, or both at a predetermined region of the substrate surface when compared to other regions of the substrate surface. For example, the difference in IEDF, ion directionality, or both may be used to adjust for non-uniformities or expected non-uniformities, e.g., material layer thickness non-uniformities, caused by substrate processing operations performed before or after the plasma-assisted etching process. In some embodiments, the sheath tuning scheme is used to shape the IEDF, e.g., to provide an IEDF with discrete dual IED peaks at the surface of the substrate and/or to provide differentially shaped IEDF across the surface of the substrate.

While the foregoing is directed to embodiments of the present disclosure, other and further embodiments of the disclosure may be devised without departing from the basic scope thereof, and the scope thereof is determined by the claims that follow.

The invention claimed is:
1. A plasma processing system, comprising:
a signal detection module configured to receive electrical signals from a plurality of first biasing circuits and to receive to receive electrical signals from one or more second pulsed voltage bias circuits, wherein:
each of the first biasing circuits comprises:
one or more first electrodes of a plurality of first electrodes disposed in a dielectric body of a substrate support, wherein the plurality of first electrodes are disposed beneath a substrate supporting surface of the dielectric body;
a first waveform generator of a plurality of first waveform generators each configured to establish a pulsed voltage waveform at the one or more first electrodes; and
a first transmission line of a plurality of first transmission lines, the first transmission line electrically coupling the first waveform generator to the one or more first electrodes, wherein each of the plurality of first waveform generators is configured to establish a pulsed voltage waveform at the one or more first electrodes electrically coupled thereto; and each of the second pulsed voltage bias circuits comprises:
- a second electrode of one or more second electrodes disposed beneath an edge ring supporting surface of the dielectric body;
- a second waveform generator of one or more second waveform generators; and
- a second transmission line of one or more second transmission lines, wherein each of the one or more second waveform generators is configured to establish a pulsed voltage waveform at the second electrode electrically coupled thereto; and a non-transitory computer-readable medium having instructions for performing a method comprising:
determining, based on an analysis of the electrical signals received by the signal detection module, one or more characteristics of a plasma or a plasma sheath formed between the substrate support and a chamber lid.

2. The plasma processing system of claim 1, wherein the signal detection module is configured to receive, by use of a plurality of signal trace lines, electrical signals from at least two different nodes, connection points, or a combination thereof for each of the plurality of first biasing circuits.

3. The plasma processing system of claim 1, wherein
each of the first biasing circuits further comprises the plasma formed between the substrate and the chamber lid, and
the method further comprises igniting and maintaining the plasma from gases or vapors delivered to a processing volume disposed between the substrate and the chamber lid.

4. The plasma processing system of claim 1, wherein the method comprises determining, based on the analysis of the electrical signals received by the signal detection module, a thickness profile of the plasma sheath based on characteristics of the plasma sheath formed over at least two different regions of the substrate.

5. The plasma processing system of claim 1, further comprising the substrate support and the plurality of first waveform generators.

6. The plasma processing system of claim 1, wherein the method further comprises electrostatically clamping the substrate to the substrate support by delivering, from a first clamping network, a clamping voltage to the plurality of first electrodes, wherein the first clamping network comprises one or more direct current power supply.

7. The plasma processing system of claim 6, wherein each of the first biasing circuits further comprises a direct current power supply of one or more direct current power supplies.

8. The plasma processing system of claim 7, wherein the method further comprises electrostatically clamping the substrate to the substrate support by delivering, from the one or more direct current power supplies, a clamping voltage to the plurality of first electrodes.

9. A plasma processing system, comprising:
a signal detection module configured to receive electrical signals from a plurality of first biasing circuits, each of the first biasing circuits comprises:
- one or more first electrodes of a plurality of first electrodes disposed in a dielectric body of a substrate support, wherein the plurality of first electrodes are disposed beneath a substrate supporting surface of the dielectric body;
- a first waveform generator of a plurality of first waveform generators each configured to establish a pulsed voltage waveform at the one or more first electrodes; and
- a first transmission line of a plurality of first transmission lines, the first transmission line electrically coupling the first waveform generator to the one or more first electrodes, wherein each of the plurality of first waveform generators is configured to establish a pulsed voltage waveform at the one or more first electrodes electrically coupled thereto; and a non-transitory computer-readable medium having instructions for performing a method comprising:
determining, based on an analysis of the electrical signals received by the signal detection module, one or more characteristics of a plasma or a plasma sheath formed between the substrate support and a chamber lid,
wherein
each of the plurality of first waveform generators are configured to establish a pulsed voltage waveform at the one or more first electrodes electrically coupled thereto,
each of the pulsed voltage waveforms comprises a series of repeating cycles,
a waveform period within each repeating cycle comprises a first portion that occurs during a first time interval and a second portion that occurs during a second time interval,
a positive or negative voltage pulse is only present during the first time interval and has a peak-to-peak voltage pulse amplitude between consecutive waveform periods,
the waveform is substantially constant or has a non-zero slope during the second time interval,
a ratio of the first time interval to the second time interval is a voltage pulse duty cycle, and
the voltage pulse duty cycle is less than 50%.

10. The plasma processing system of claim 9, wherein
each of the pulsed voltage waveforms comprises sequential reputations of burst-on periods and burst-off periods,
each of the pulsed voltage waveforms comprises a series of repeating cycles during the burst-on periods,
an output of the first waveform generator used to establish the respective pulsed voltage waveform is stopped during the burst-off periods.

11. The plasma processing system of claim 10, wherein determining the characteristic of the plasma or plasma sheath comprises comparing characteristics of the electrical signals received during the burst-on periods to characteristics of the electrical signals received during the burst-off periods.

12. The plasma processing system of claim 9, wherein the method further comprises: (a) comparing the determined characteristics of the plasma or plasma sheath to one or more desired characteristics of the plasma or plasma sheath; and
(b) based on the comparison at (a), differently biasing one or more regions of the substrate.

13. The plasma processing system of claim 12, wherein differently biasing the one or more regions of the substrate comprises adjusting one or more characteristics of a pulsed voltage waveform established at at least one of the plurality of first electrodes to a characteristic of a pulsed voltage waveform established at one or more other ones of the plurality of first electrodes.

14. The plasma processing system of claim 13, wherein differently biasing the one or more regions of the substrate changes a shape of a portion of plasma sheath formed between the substrate and the plasma.

15. The plasma processing system of claim 1, wherein the method further comprises:
  establishing, by use of the one or more second waveform generators, pulsed voltage waveforms at the one or more second electrodes.

16. The plasma processing system of claim 15, wherein the method further comprises;
  (c) comparing the determined characteristics of the plasma or plasma sheath to one or more desired characteristics of the plasma or plasma sheath; and
  (d) based on the comparison at (c), differently biasing one or more regions of an edge ring disposed on the edge ring supporting surface.

17. The plasma processing system of claim 16, wherein differently biasing the one or more regions of the edge ring comprises:
  determining, based on an analysis of the electrical signals received by the signal detection module, a characteristic of a portion of the plasma or plasma sheath formed over a circumferential edge of the substrate;
  comparing the determined characteristic of the portion of the plasma or plasma sheath to a desired characteristic; and
  based on the comparison of the determined characteristic to the desired characteristic of the portion of the plasma or plasma sheath, adjusting one or more characteristics of the pulsed voltage waveform established at at least one of the one or more second electrodes relative to the one or more characteristics established at at least one of the plurality of first electrodes.

18. The plasma processing system of claim 16, wherein
  the one or more second electrodes comprises a plurality of second electrodes,
  the one or more second waveform generators comprises a plurality of second waveform generators, and
  differently biasing the one or more regions of the edge ring comprises:
    determining, based on an analysis of the electrical signals received by the signal detection module, a characteristic of a portion of the plasma or plasma sheath formed over a circumferential edge of the substrate;
    comparing the determined characteristic of the portion of the plasma or plasma sheath to a desired characteristic; and
    based on the comparison of the determined characteristic to the desired characteristic of the portion of the plasma or plasma sheath, adjusting one or more characteristics of the pulsed voltage waveform established at at least one of the plurality of second electrodes relative to the one or more characteristics established at at least one other one of the plurality of second electrodes.

19. The plasma processing system of claim 18, wherein the method further comprises:
  igniting and maintaining the plasma from gases or vapors delivered to a processing volume disposed between the substrate and the chamber lid by one of:
    delivering a radio frequency signal to the chamber lid or a support base having the substrate support disposed thereon; or
    delivering a radio frequency signal to a plasma generator assembly to generate an electromagnetic field in the processing volume.

* * * * *